US006885328B1

(12) United States Patent
Kao et al.

(10) Patent No.: US 6,885,328 B1
(45) Date of Patent: Apr. 26, 2005

(54) DIGITALLY-SWITCHED IMPEDANCE WITH MULTIPLE-STAGE SEGMENTED STRING ARCHITECTURE

(75) Inventors: David T. Kao, Sunnyvale, CA (US); James J. Ashe, Saratoga, CA (US)

(73) Assignee: Analog Devices, Inc., Norwood, MA (US)

( * ) Notice: Subject to any disclaimer, the term of this patent is extended or adjusted under 35 U.S.C. 154(b) by 91 days.

(21) Appl. No.: 10/641,658

(22) Filed: Aug. 15, 2003

(51) Int. Cl.[7] .............................................. H03M 1/66
(52) U.S. Cl. ...................................... 341/144; 341/154
(58) Field of Search ................................ 341/144, 145, 341/147, 148, 153, 154

(56) References Cited

U.S. PATENT DOCUMENTS

| | | | |
|---|---|---|---|
| 5,495,245 A | 2/1996 | Ashe | 341/145 |
| 5,568,147 A * | 10/1996 | Matsuda et al. | 341/154 |
| 6,201,491 B1 | 3/2001 | Brunolli et al. | 341/144 |
| 6,384,762 B1 | 5/2002 | Brunolli et al. | 341/144 |
| 6,414,616 B1 | 7/2002 | Dempsey | 341/144 |
| 6,567,026 B1 * | 5/2003 | Gorman | 341/154 |

* cited by examiner

*Primary Examiner*—Brian Young
(74) *Attorney, Agent, or Firm*—Koppel, Jacobs, Patrick & Heybl

(57) ABSTRACT

A multiple-stage digitally-switched impedance has one "type B" stage and at least two "type A" stages. The type A stages are cascaded between high and low reference nodes and the type B stage. Each stage comprises a string of series-connected impedances and a switch network. A decoder responds to an digital input signal by controlling the switch networks to switch selectable portions of the strings in the type A stages into a series connection with the type B stage's string, and to control the type B stage's switch network to tap its string at a location to provide a impedance corresponding to the n-bit digital input signal between the final output node and at least one of the high and low reference nodes. Each stage provides a portion of the impedance's n-bit resolution, and the sum of the bits of resolution provided by each stage equals the total n-bit resolution.

26 Claims, 33 Drawing Sheets

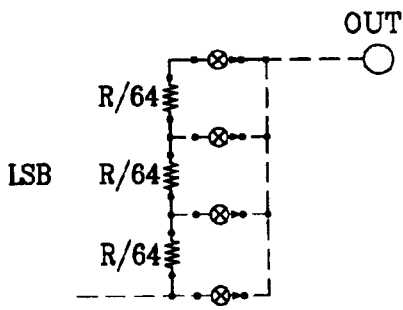
FIG.18b
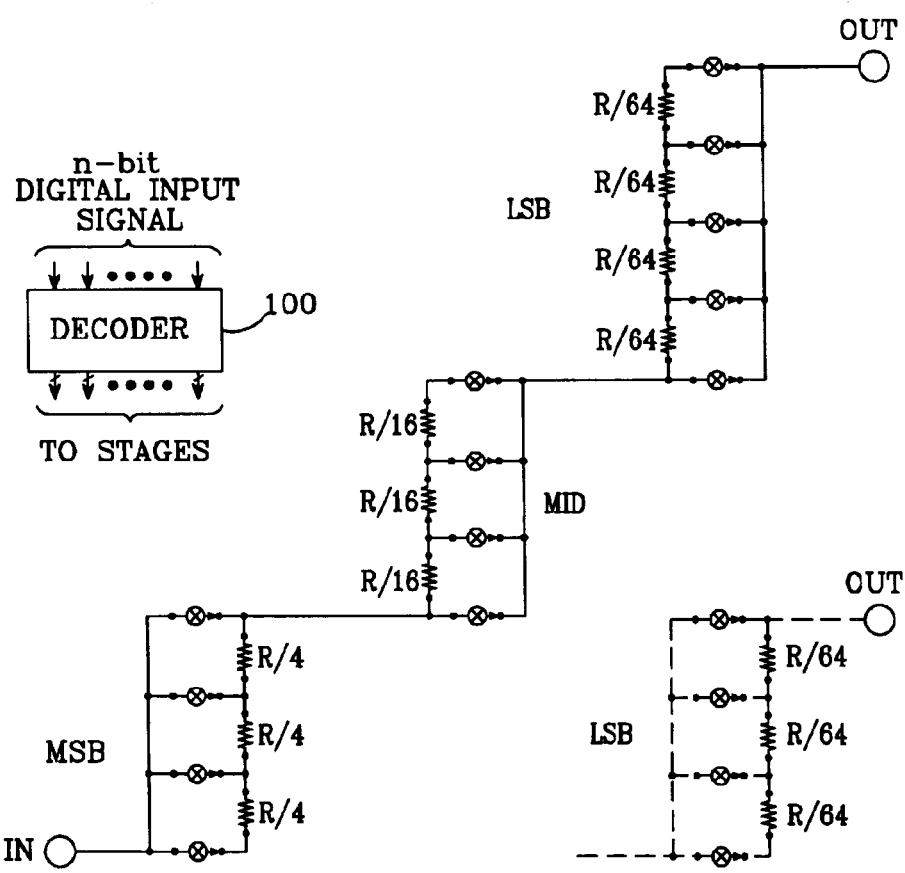
FIG.18a
FIG.18c

DIGITALLY-SWITCHED IMPEDANCE WITH MULTIPLE-STAGE SEGMENTED STRING ARCHITECTURE

BACKGROUND OF THE INVENTION

1. Field of the Invention

This invention relates to the field of digitally-switched impedances.

2. Description of the Related Art

One method of providing a desired impedance is to connect a selectable number of fixed impedances in series. A switching network connects the impedances together in response to a digital input signal. Such a "digitally-switched impedance" may be used, for example, as a potentiometer, rheostat, variable resistor, or a digital-to-analog converter (DAC).

A "resistive" DAC can be provided by connecting the ends of a series-connected impedance string between high and low reference voltages, with the low reference generally being set at ground, and selectively tapping the string to provide a desired analog output voltage. These types of converters are used most commonly as building blocks in MOS analog-to-digital conversion systems, where they function as the DAC subsection of a successive-approximation-type analog-to-digital converter. For an N-bit resistive DAC, the impedance string consists of $2^N$ identical resistors connected in series, and is used as a potentiometer in which the voltage levels between successive resistors are sampled by means of binary switches. Replacing mechanical potentiometers and rheostats is an important and potentially very high volume application for these devices.

FIG. 1 is a schematic diagram of an N-bit DAC that operates on the voltage-scaling principle. A resistor string consisting of resistors R1, R2, R3, . . . , R$2^N$–1, R$2^N$ is connected between a high reference voltage (VREF+) node 2 and a low reference voltage (VREF−) node 4, which are typically 5 volts and ground potential, respectively. The voltage drop across each resistor is equal to one least significant bit (LSB) of output voltage change. The output is selected by a switch network, illustrated as switches S1, S2, S3, . . . , S$2^N$. Each switch taps a different point in the resistor string, so that closing a particular switch while leaving the other switches open places a unique analog voltage on a common output line 6 to which each of the switches is connected. A decoder (not shown) receives a digital input signal, and in response, controls the operation of the switches so that the switch whose voltage corresponds to the magnitude of the digital input signal is closed. The signal on analog output line 6 is sensed by a high-impedance buffer amplifier or voltage follower A1, the output of which is connected to an output terminal 8 that provides the final output analog voltage.

A principal drawback of this type of circuit for high-bit-count D/A converters is the very large number of components required: $2^N$ resistors, $2^N$ switches and $2^N$ logic drive lines. For example, in a 12-bit implementation, this approach would use 4,096 resistors, 4,096 switches and 4,096 logic drive lines. It would be highly desirable to significantly reduce this large number of elements for purposes of area savings, higher manufacturing yields and lower costs.

Resistive DACs are presently available which greatly reduce the number of required resistors and switches by using one resistor string consisting of $2^{N/2}$ resistors for the digital input signal's most significant bits (MSBs), and a separate resistor string also consisting of $2^{N/2}$ resistors for the LSBs. Each resistor in the LSB string has a resistance value equal to $\frac{1}{2}^{N/2}$ the resistance of each MSB resistor. The opposite ends of the LSB string are connected across one of the MSB resistors. By varying the MSB resistor selected for the LSB string connection and taking an output from the LSB string, outputs in one LSB increments can be obtained over the full range of one to $2^N$–1 LSBs. Two such circuits are the AD569 and AD7846 DACs from Analog Devices, Inc. However, to preserve the constant resistance characteristic of the MSB string, active amplifier buffer circuits must be used to interface between the MSB string and its connection to the LSB string. This unfortunately makes the device unusable for potentiometer and rheostat purposes.

Another reduced parts count resistor-switch configuration for a digital potentiometer is disclosed in U.S. Pat. No. 5,495,245 by James J. Ashe. Referring to FIG. 2 of the Ashe patent, the digital potentiometer uses two outer strings 10 and 12 to provide a decremented voltage pattern that supplies an analog signal corresponding to the MSBs of the digital input signal, while an inner string 14 provides an analog signal corresponding to the LSBs; alternately, the outer strings can provide the LSBs and the inner string the MSBs. The two outer strings 10 and 12 are identical, with the high voltage end of the first outer string connected to a high reference voltage VREF+, and the low voltage end of the second outer string 12 connected to a low reference voltage VREF−. The opposite ends of the inner string 14 are connected to the first and second outer strings through respective outer switch networks that are operated by a decoder (not shown); the decoder in effect causes the opposite ends of the inner string to "slide" along the two outer strings. This "sliding" keeps a constant number of outer string resistors in the circuit, regardless of where the outer strings are tapped. No active elements are required to buffer the inner string from the outer string, which allows the circuit to be used as a potentiometer or rheostat. The output voltage is obtained by tapping a desired location in the inner string 14. In the Ashe invention, each MSB resistor string includes $2^{N/2}$–1 resistors and $2^{N/2}$ switches, and each LSB string includes $2^{N/2}$ resistors and $2^{N/2}$ switches. The Ashe digital potentiometer results in a significant reduction in the number of both resistors and switches, compared to the potentiometer circuit illustrated in FIG. 1.

However, the digital potentiometer disclosed in Ashe has inherent non-linearity due to resistor, interconnect and switch resistance mismatches, and may also exhibit long switching settling times caused by large internal capacitances that arise from the parallel connected switches located on the output taps of the MSB resistor strings. Furthermore, though resistor and switch counts are reduced, the disclosed potentiometer still requires a substantial number of both to realize a high-resolution DAC.

U.S. Pat. Nos. 6,201,491 and 6,384,762 to Brunolli et al., and U.S. Pat. No. 6,414,616 to Dempsey, employ a two-stage digitally-switched potentiometer implementation similar to that shown in Ashe. However, as with Ashe, achieving a high resolution still requires a substantial number of resistors and switches, and a correspondingly large die area for their integration.

SUMMARY OF THE INVENTION

A multiple-stage digitally-switched impedance is presented which overcomes the problems noted above, enabling the number of impedances, switch count, and required die area to be reduced when compared with prior art designs having the same resolution.

The present digitally-switched impedance has at least three "stages": one "type B" stage and at least two "type A" stages. Each type A stage includes an upper stage and lower stage pair, with each upper and lower stage having an input node and an output node. The type B stage has first and second input nodes and a final output node. The stages are arranged such that the input nodes of the upper and lower stages of a first type A stage are connected to high and low reference nodes, respectively, with their output nodes connected to the input nodes of a following type A stage. All the type A stages are cascaded in this way, with the output nodes of the last type A stage connected to the first and second input nodes of the type B stage.

Each of the upper and lower stages comprises a string of predetermined series-connected impedances, and a switch network arranged to connect a selected number of the impedances between the stage's input and output nodes. The type B stage comprises a string of predetermined impedances series-connected between its first and second input nodes, and a switch network connected to provide a selectable tap from the string to the final output node.

A decoder responds to an n-bit digital input signal by controlling the switch networks to switch selectable portions of the strings in the type A stages into a series connection with the type B stage's string, and to control the type B stage's switch network to tap its string at a location to provide a impedance corresponding to the n-bit digital input signal between the final output node and at least one of the high and low reference nodes. The digitally-switched impedance is arranged such that the selected portions have a substantially constant aggregate series impedance between the high and low reference nodes over the type A stages' switching ranges. The number of impedances and their respective values are arranged such that each stage provides a portion of the digitally-switched impedance's n-bit resolution, and that the sum of the bits of resolution provided by each stage equals the total n-bit resolution.

Further features and advantages of the invention will be apparent to those skilled in the art from the following detailed description, taken together with the accompanying drawings.

BRIEF DESCRIPTION OF THE DRAWINGS

FIGS. 2b and 2c are schematic diagrams illustrating possible implementations of the type A and type B stages shown in FIG. 2a.

FIG. 3b is a chart illustrating the operation of the switches in the digitally-switched impedance of FIG. 3a to achieve the impedance's possible outputs.

FIGS. 4a–15a are alternative embodiments of digitally-switched impedances per the present invention.

FIGS. 4b–15b are charts illustrating the operation of the switches in the digitally-switched impedances of FIGS. 4a–15a, respectively, to achieve the impedances' possible outputs.

FIG. 18a is an embodiment of a digitally-switched impedance which functions as a variable resistor.

FIG. 18b is an alternative embodiment of an LSB stage which might be used with the digitally-switched impedance shown in FIG. 18a.

FIG. 18c is another alternative embodiment of an LSB stage which might be used with the digitally-switched impedance shown in FIG. 18a.

DETAILED DESCRIPTION OF THE INVENTION

Figure 2A:
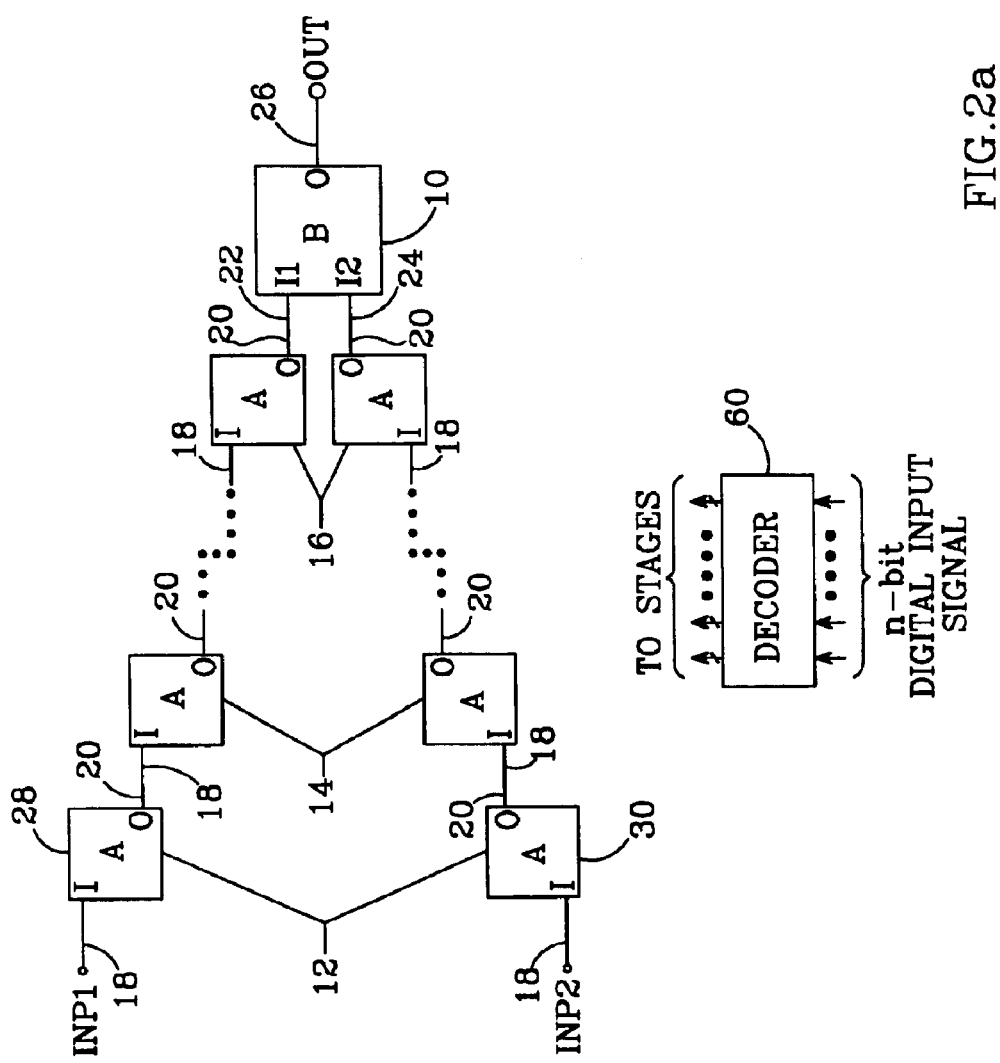
FIG. 2a is a block diagram illustrating the principles of a digitally-switched impedance per the present invention.

A digitally-switched impedance in accordance with the present invention is suitable for use as, for example, a digital potentiometer, a resistive DAC, or a variable resistor. The basic principles of the present digitally-switched impedance are illustrated in FIG. 2a. The impedance circuit is comprised of at least three stages: one "type B" stage 10 and at least two "type A" stages (12, 14, 16). Each type A stage has an input node 18 and an output node 20; the type B stage has two input nodes (22, 24) and an output node 26.

Each type A stage consists of an "upper" stage 28 and a "lower" stage 30 pair. The type A stages are cascaded between a pair of high and low reference nodes (INP1 and INP2) and the type B stage, as follows: the upper and lower input nodes of a first type A stage are connected to high and low reference nodes INP1 and INP2, respectively. The first stage's upper and lower output nodes are connected to the upper and lower input nodes, respectively, of the following type A stage. The type A stages are all cascaded in this way except for a last type A stage, the upper and lower output nodes of which are connected to the first and second input nodes, respectively, of the type B stage. The type B stage's output node serves as the digitally-switched impedance's final output OUT.

Figure 2B:
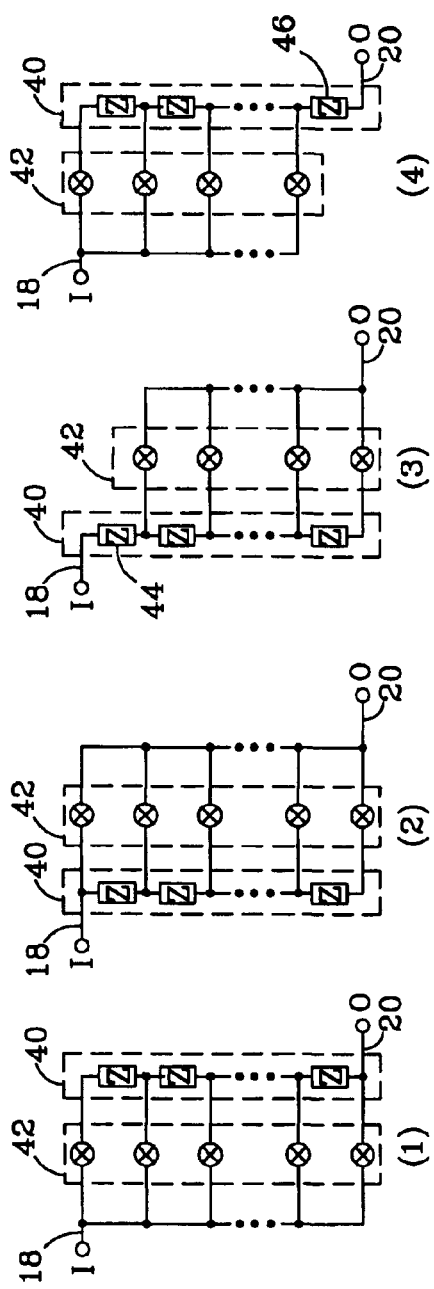

Possible implementations of an upper or lower type A stage are shown in FIG. 2b. Each implementation includes a string of predetermined series-connected impedances 40, and a switch network 42 arranged to connect a selected number of the string's impedances between the stage's input and output nodes. Note that, though the series-connected impedances are commonly shown and described herein as resistors, it is understood that the invention is not limited to purely resistive impedances, and that each resistor could also represent a complex impedance.

The switch network's switches can be connected on either the input side or the output side of the string. In implementation 1, input node 18 is connected to one side of each switch in switch network 42, and the other sides of the switches are connected to respective points along string 40, which is also connected to output node 20. In implementation 2, output node 20 is connected to one side of each switch in switch network 42, and the other sides of the switches are connected to respective points along string 40, which is also connected to input node 18.

Implementations 3 and 4 are similar to 1 and 2, except for that each includes an extra impedance which does not have a switch connected to one of its terminals. These implementations are only used when a type A stage provides the least-significant bits (LSBs) of the digitally-switched impedance's resolution; this will be discussed in more detail below. For implementation 3, output node 20 is connected to one side of each switch in switch network 42, and the other sides of the switches are connected to respective points along string 40, which is also connected to input node 18.

One impedance (44) does not have a switch connected to its upper terminal. For implementation 4, input node 18 is connected to one side of each switch in switch network 42, and the other sides of the switches are connected to respective points along string 40, which is also connected to output node 20. One impedance (46) does not have a switch connected to its lower terminal.

Figure 2C:
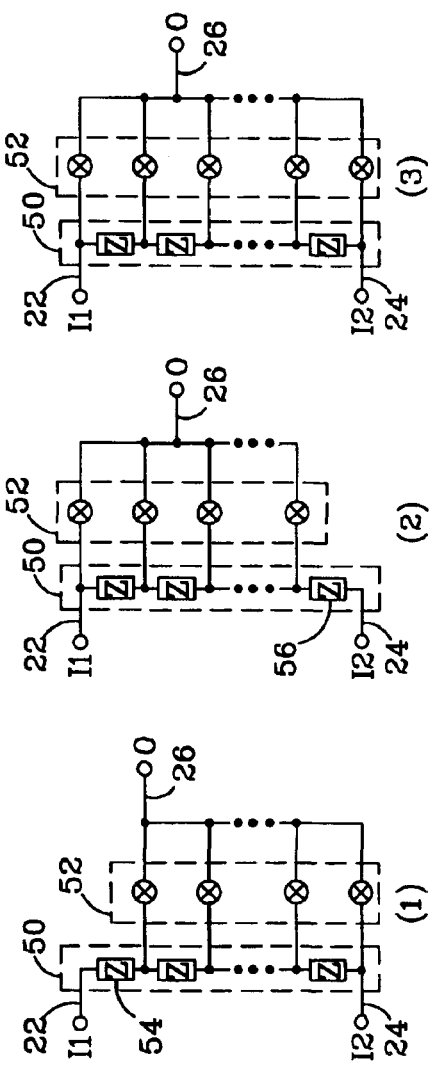

Possible implementations of a type B stage are shown in FIG. 2c. Each implementation includes a string of predetermined series-connected impedances 50, and a switch network 52 arranged to provide a selectable tap from the string to output node 26. When employed as a digital potentiometer, the string is always connected between input nodes 22 and 24 so that the type B stage presents a constant impedance between its input nodes. Implementations 1 and 2 are used only when a type B stage provides the least-significant bits (LSBs) of the digitally-switched impedance's resolution; this will be discussed in more detail below. In implementation 1, output node 26 is connected to one side of each switch in switch network 52, and the other sides of the switches are connected to respective points along string 50, which is connected between input nodes 22 and 24. One impedance (54), at the top of string 50, does not have a switch connected to its upper terminal. Implementation 2 is similar, except that one impedance (56), at the bottom of string 50, does not have a switch connected to its lower terminal. In implementation 3, each terminal of impedance string 50 is connected to a respective switch in switch network 52.

Referring back to FIG. 2a, a decoder 60 is used to operate the switch networks in each stage to achieve a desired impedance between output node 26 and at least one of the high and low reference nodes INP1 and INP2. The decoder receives an n-bit digital input signal, and in response, operates the switch networks (42) to switch portions of the strings (40) in the type A stages into a series connection with the type B stage's string (50). The decoder further controls the type B stage's switch network (52) to tap the type B stage's string at a location to provide a impedance corresponding to the n-bit digital input signal between output node 26 and at least one of high and low reference nodes INP1 and INP2. When configured as shown in FIG. 2a, the digitally-switched impedance is arranged so that the selected portions have a substantially constant aggregate series impedance $Z_{total}$ between the high and low reference nodes over the switching ranges of the type A stages.

The number and values of the impedances in the stages are arranged such that each stage provides a portion of the digitally-switched impedance's n-bit resolution, and that the sum of the bits of resolution provided by each stage equals the total n-bit resolution.

As noted above, the switches of a type A stage's switch network can be connected on either the input side or the output side of the string, and this arrangement may differ between the upper and lower stages. For example, the upper stage of a type A pair can have its switches connected on the input side of the string, while its lower stage has its switches connected on the output side of the string.

MOSFETs would typically be used as the switches for a digitally-switched impedance per the present invention. However, the invention is by no means limited to use with MOS switches. Any switch type that provides a very low resistance path when closed and a very high resistance path when open could be employed.

One way in which the present digitally-switched impedance might be implemented is with a first type A stage connected to the high and low reference nodes INP1 and INP2 and providing the impedance's MSBs of resolution. When so arranged, the MSB stage's switches—typically MOSFETs—are preferably connected on the input side of their respective strings. This tends to reduce the non-linearities in the impedance's output characteristic that might otherwise be introduced by the MOS switches. For the "middle stages"—i.e., the type A stages coupled between the MSB stage and the last, type B stage—the switches are preferably connected on the output side of their respective strings, which tends to reduce the contribution of the MOS switches to differential nonlinearities in the output. If the middle stages' switches were connected on the input side, they would see voltage changes corresponding to MSB code changes. With the middle stages' switches on the output side, they only see voltage changes corresponding to changes in the middle bits of resolution, which are smaller than the MSB voltage changes.

When the digitally-switched impedance is configured as a digital potentiometer, the type B LSB stage must have its switches connected on the output side of its string, to maintain a constant aggregate series impedance $Z_{total}$ between the high and low reference nodes.

Note that the invention does not require that the stages be ordered as described above. As will be described in more detail below, the LSB stage can be a first or middle stage (and thus a type A stage), or the last, type B stage. Similarly, the MSB stage, as well as a stage providing the middle bits of resolution, can be a first or middle type A stage, or the last, type B stage.

The use of three or more stages enables the number of impedances and the number of switches to be significantly reduced in comparison with prior art designs. The composition of the stages for a digitally-switched impedance in accordance with the present invention is as defined below:

Upper or lower stage of a Type A stage, or a type B stage, which does not provide the LSBs of resolution:
1) # of switches in switch network=$2^m$, where m is the number of bits of resolution provided by the stage;
2) # of series-connected impedances in string=$2^m-1$;
3) value of impedances=$Z_{total}/2^k$, where $Z_{total}$=the aggregate series impedance $Z_{total}$ maintained between the high and low reference nodes, and k is the number of bits of resolution provided by the stage plus the number of bits of resolution provided by all stages that provide more significant bits of resolution.

Upper or lower stage of a Type A stage which is providing the LSBs:
1) # of switches in switch network=$2^m$ or $2^m+1$ (depending on embodiment), where m is the number of bits of resolution provided by the stage;
2) # of series-connected impedances in string=$2^m$ or $2^m-1$ (depending on embodiment);
3) value of impedances=$Z_{total}/2^n$, where $Z_{total}$=the aggregate series impedance $Z_{total}$ maintained between the high and low reference nodes, and n is the number of bits of resolution provided by the entire digitally-switched impedance.

Type B stage which is providing the LSBs:
1) # of switches in switch network=$2^m$ or $2^m+1$ (depending on embodiment), where m is the number of bits of resolution provided by the stage;
2) # of series-connected impedances in string=$2^m$ ($2^m-1$ for a configuration discussed below in relation to FIGS. 15a and 15b).
3) value of impedances=$Z_{total}/2^n$, where $Z_{total}$=the aggregate series impedance $Z_{total}$ maintained between the high and low reference nodes, and n is the number of bits of resolution provided by the entire digitally-switched impedance.

The embodiment-dependent definitions provided above arise due to the fact that the stage providing the LSBs can take on a special configuration wherein the impedance element at one end of the string may not have a switch connected to one of its terminals. This is illustrated in the exemplary digitally-switched impedance circuit shown in FIG. 3a, which has a resolution of 6 bits. The circuit has 3 stages: a type A MSB stage 60 which provides 2 MSBs of resolution, a type A middle stage 62 which provides 2 bits of resolution, and a type B stage 64 which provides 2 LSBs of resolution. Each of the upper and lower stages of the MSB stage consists of $2^m=2^2=4$ switches (S1–S4, S17–S20), and $2^m-1=2^2-1=3$ series-connected impedances. The value of each impedance is given by $Z_{total}/2^k$, where k is the number of bits of resolution provided by the MSB stage (2) plus the number of bits of resolution provided by all stages that provide more significant bits of resolution (none). Thus, assuming that the series-connected impedances are simple resistors and that $Z_{total}$ is the constant aggregate series resistance R between the high and low reference nodes, each MSB stage impedance is given by $R/2^2=R/4$.

As the middle stage is also a type A stage which provides 2 bits of resolution, neither of which are LSBs, its upper and lower stages each include $2^m=2^2=4$ switches (s5–S8, S13–S16), and $2^m-1=2^2-1=3$ series-connected resistors. Here, however, the k value is 4: the 2 bits of resolution provided by stage 62 plus the 2 bits of resolution provided by stage 60—which is the only stage that provides more significant bits than stage 62. Thus, each resistor is given by $R/2^{2+2}=R/16$.

Figure 3A:
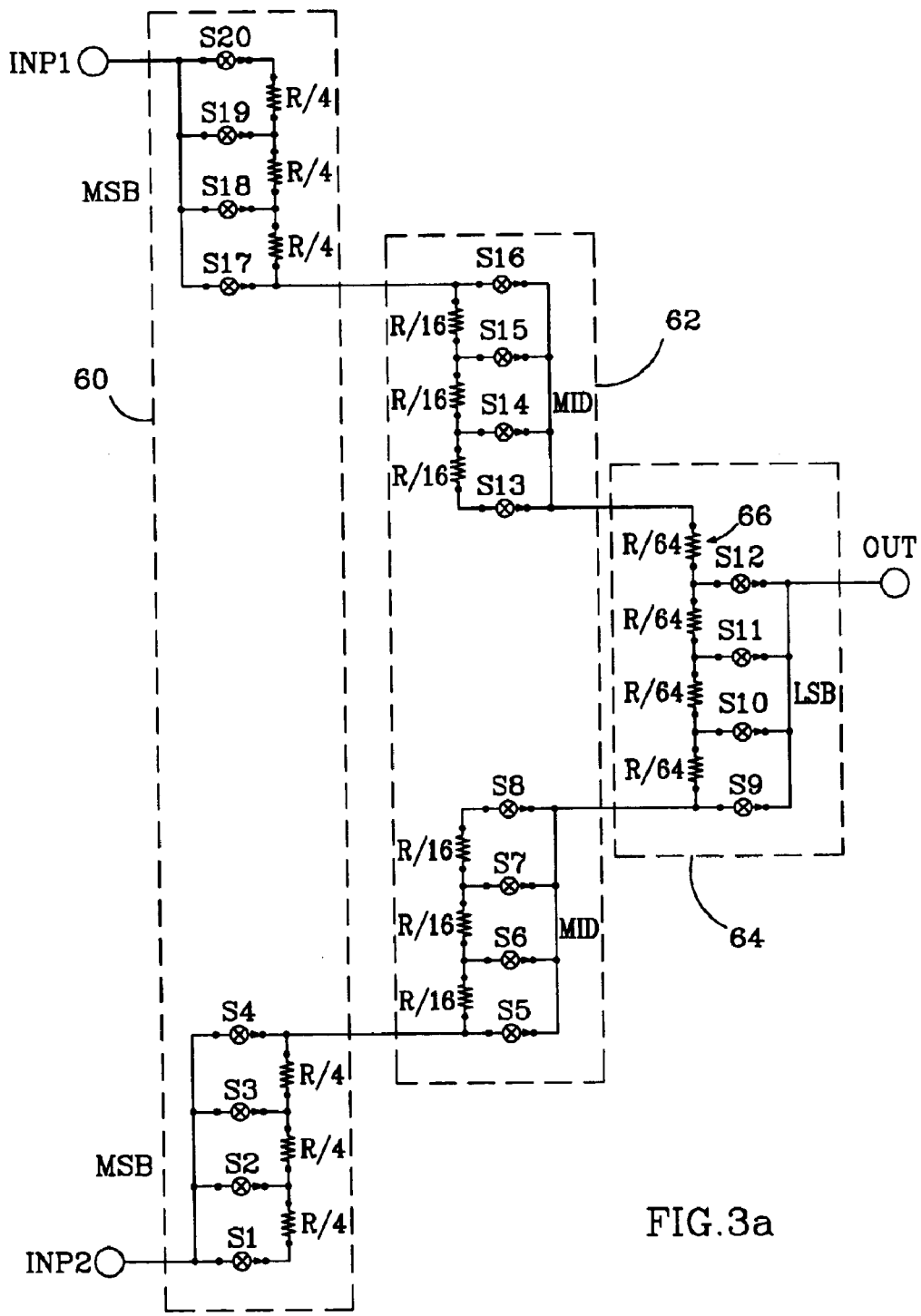
FIG. 3a is one possible embodiment of a 3-stage digitally-switched impedance per the present invention.

For the type B LSB stage 64 shown in FIG. 3a, there are $2^m=2^2=4$ switches (S9–S12), and $2^m=2^2=4$ series-connected resistors. The value of each resistance is given by $R/2^n$. Here, n=6, and thus each resistance is given by $R/2^6=R/64$.

The exemplary embodiment shown in FIG. 3a clearly demonstrates the reduction in the number of impedances, switches and logic lines achieved with the present invention when compared with prior art designs. Whereas a conventional string such as that in FIG. 1 would realize 6 bits of resolution with 64 series-connected resistors, 64 switches, and 64 logic lines, the embodiment shown in FIG. 3a requires only 16 resistors, 20 switches, and 20 logic lines. Thus, the same functionality is provided with far fewer components, which can be fabricated within a correspondingly smaller die area.

Figure 1:
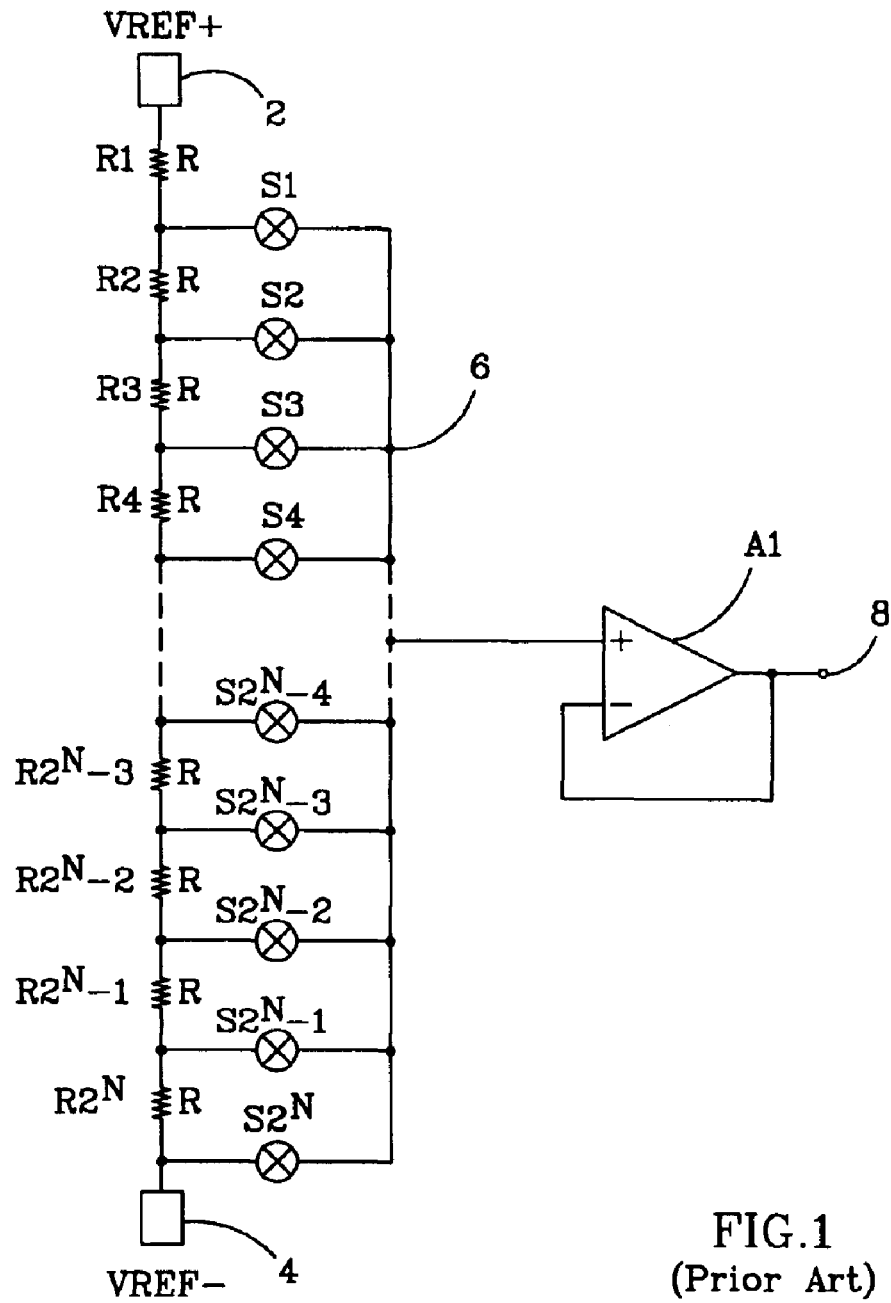
FIG. 1 is a schematic diagram of a prior art resistive DAC.

A conventional string such as that in FIG. 1 would realize 6 bits of resolution with 64 series-connected resistors, which could provide a maximum of 65 possible outputs, including zero-scale and full-scale. The arrangement shown in FIG. 3a can also provide a maximum of 65 possible outputs. However, when a 6-bit digital input word is used, only $2^6=64$ of these outputs can be selected.

As such, when a 6-bit digital input signal is employed, one of the possible outputs must be omitted. In LSB stage 64, the upper terminal of a resistor 66 in the series-connected string is not connected to the stage's switch network, making the output at this terminal inaccessible. This is the possible output which has been omitted: resistor 66 is an "extra" resistor that corresponds to a 1 LSB full-scale offset, which results from only being able to address $2^i$ of possible $2^n+1$ output levels with an n-bit digital word. Note that if the "extra" resistor is at the bottom of LSB stage 64 (rather than the top as shown in FIG. 3a), the extra resistor corresponds to a 1 LSB zero-scale offset.

Figure 3B:
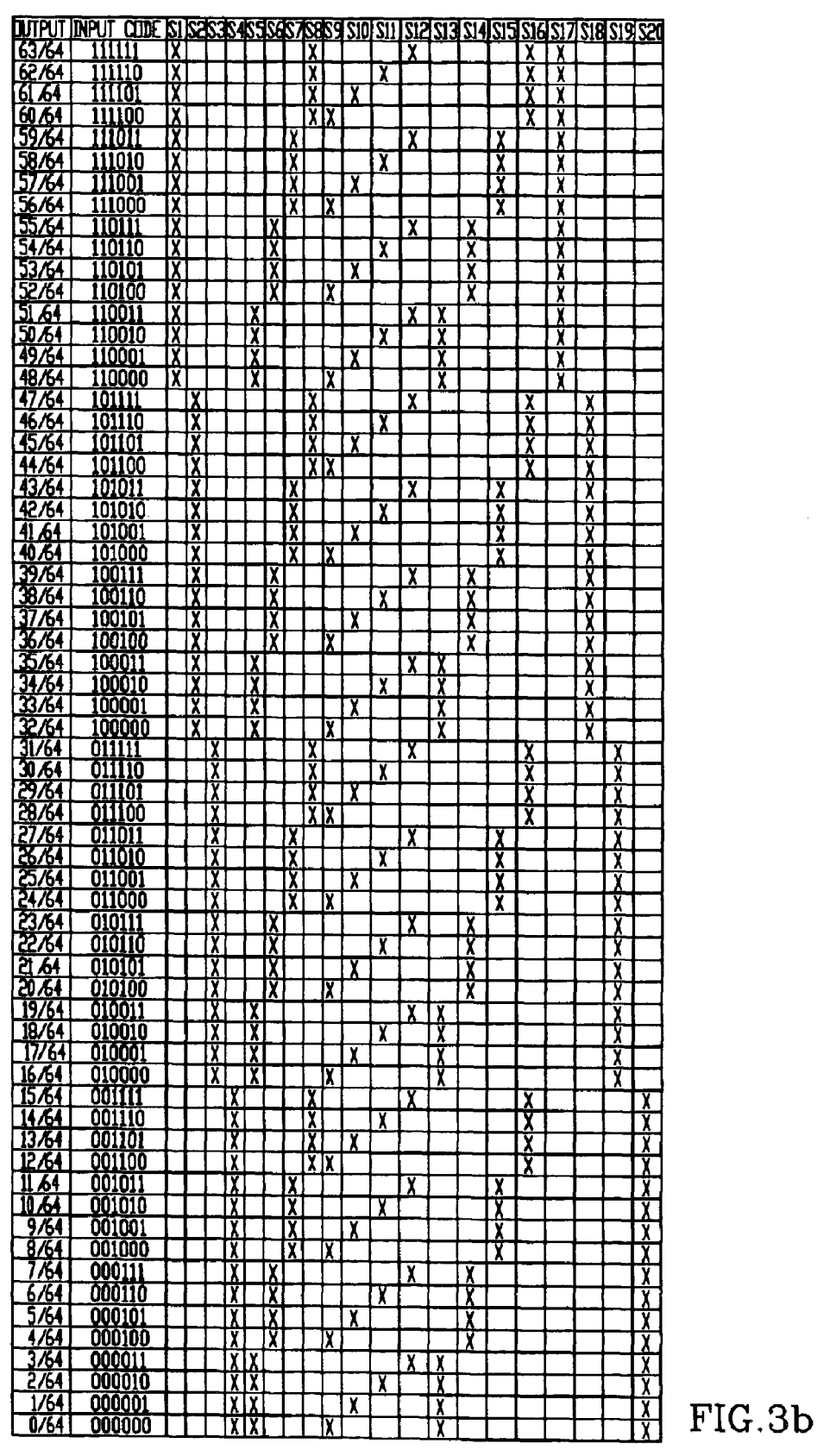

As noted above, the present digitally-switched impedance is arranged so that there is a substantially constant aggregate series impedance $Z_{total}$ between the high and low reference nodes over the switching ranges of the type A stages. This is illustrated by reference to the switch operation chart shown in FIG. 3b, which illustrates how the switch networks in FIG. 3a might be operated in response to a digital input signal in order to provide 64 possible outputs. A decoder (not shown) receives the 6 bit digital input code, and in response, operates switches S1–S20 as shown in FIG. 3b to provide the 64 possible outputs. Note that the switches are operated such that there is a constant number of resistors of each value connected between INP1 and INP2 for every input code. That is, for every one of the 64 possible digital input codes, there are always three resistors of value R/4, three resistors of value R/16, and four resistors of value R/64 connected in series between INP1 and INP2, such that there is a constant resistance R between INP1 and INP2. This is accomplished by arranging the switch operation chart such that, when a resistor in an upper type A stage is switched into the overall string, the corresponding resistor in the lower stage is switched out, and vice versa.

When operated as shown in FIG. 3b, a digital input signal of "000000" results in a resistance of 0 between OUT and INP2, and a resistance of R between OUT and INP1. A digital input signal of "000001" results in a resistance of R/64 between OUT and INP2, and a resistance of (63/64)*R between OUT and INP1. The resistance shifts in this way from the upper half to the lower half as the digital input signal increases, with a digital input signal of "111111" resulting in a resistance of R/64 between OUT and INP1, and a resistance of (63/64)*R between OUT and INP2. By moving or "sliding" the strings up and down with respect to each other using the switches in this manner, a desired impedance can be provided between OUT and INP1 or INP2 with a resolution of (1/64)*R.

The relationship pattern between digital input signal and resulting resistance just described, in which the resistance gradually shifts from one half to the other as the digital input signal increases, is reflected in all the subsequent switch operation charts discussed below. Note, however, that the invention is not limited to this operating pattern. The decoder could be arranged to provide any desired correspondence between the 64 possible outputs and the $2^n$ possible digital input signals.

Decoders as required by the present digitally-switched impedance are well-known to those familiar with digital logic design, and can be implemented in many different ways.

Figure 4A:
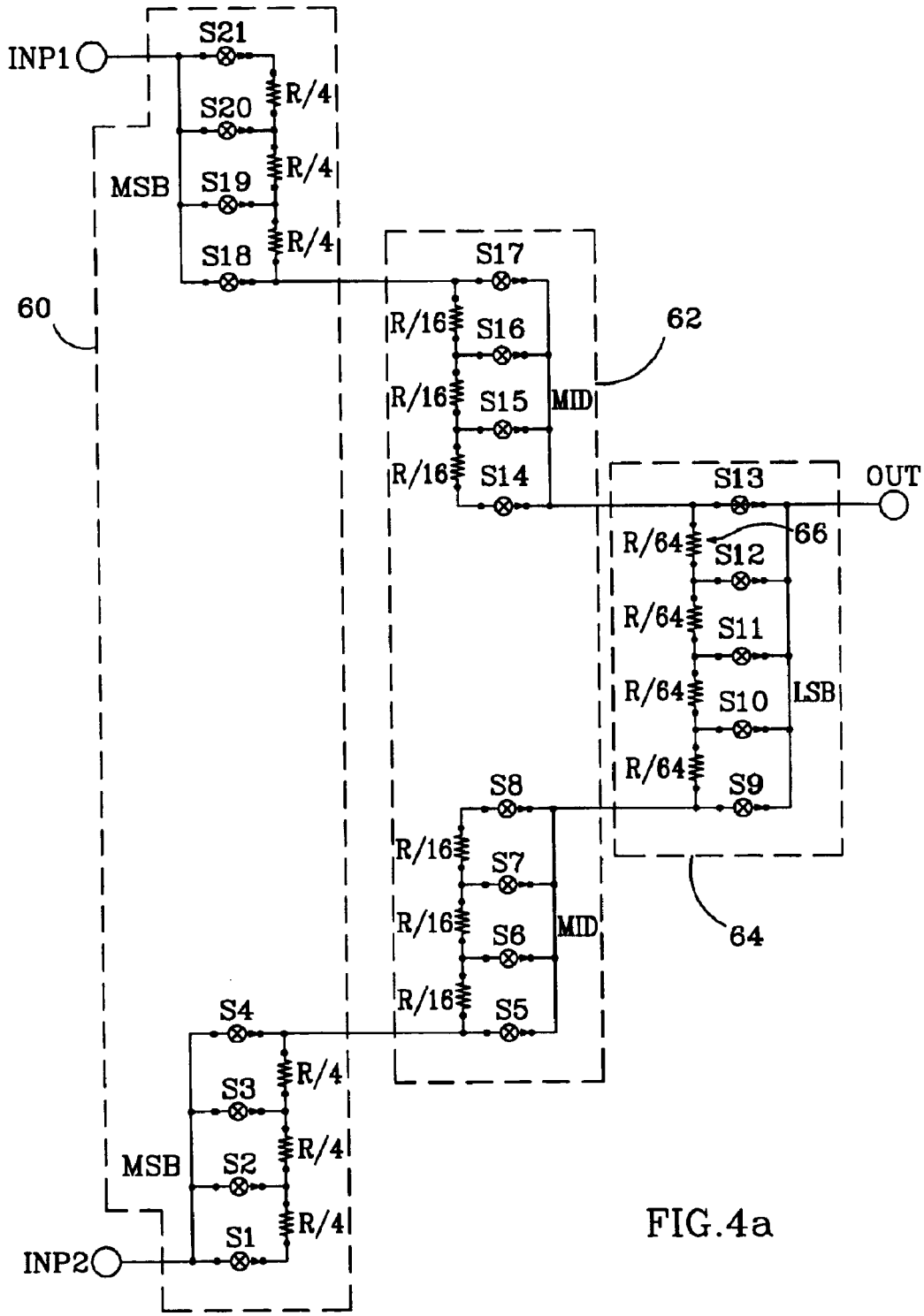
Figure 4B:
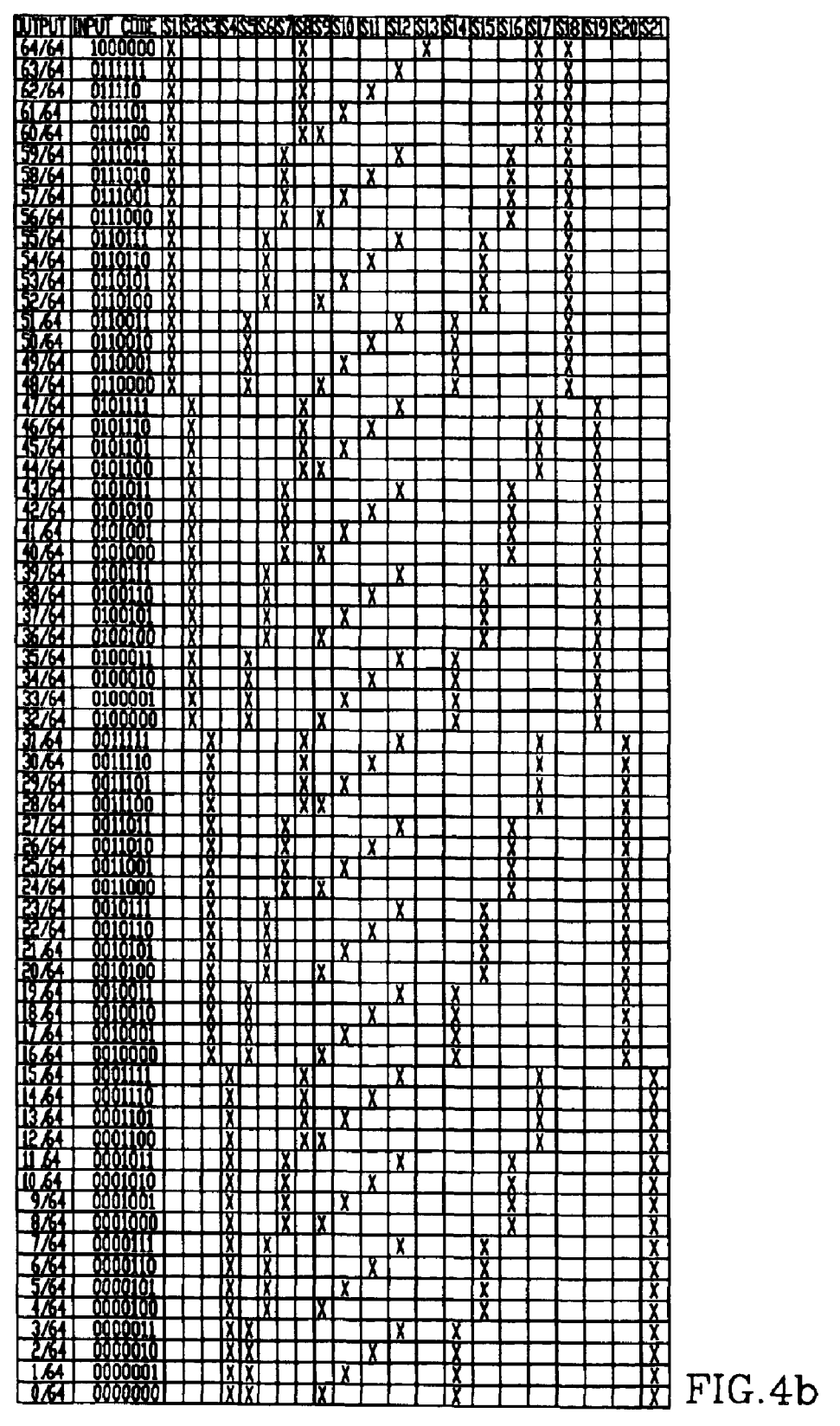

If a digital input word having greater than n bits is used, the "extra" resistor arrangement shown in FIG. 3a would not be necessary, although the extra resistor would still be needed to enable the LSB stage to contribute the proper four R/64 resistance values necessary to maintain the total resistance R between INP1 and INP2. In this case, the extra resistor has switches connected to both of its terminals, instead of having one open terminal. This is illustrated in FIG. 4a. This implementation is identical to that shown in FIG. 3a, except that "extra" resistor 66 in LSB stage 64 has switches (S12, S13) connected to both of its terminals. This is an example of a type B LSB stage for which the number of switches in its switch network is given by $2^m+1$; here, $2^2+1=5$ switches. This enables the digitally-switched impedance to offer all 65 possible outputs, with no zero or full-scale offset—though a digital input signal having at least 7 bits is required. The chart shown in FIG. 4b illustrates how the switch networks in FIG. 4a might be operated in order to provide the 65 possible outputs.

Figure 5A:
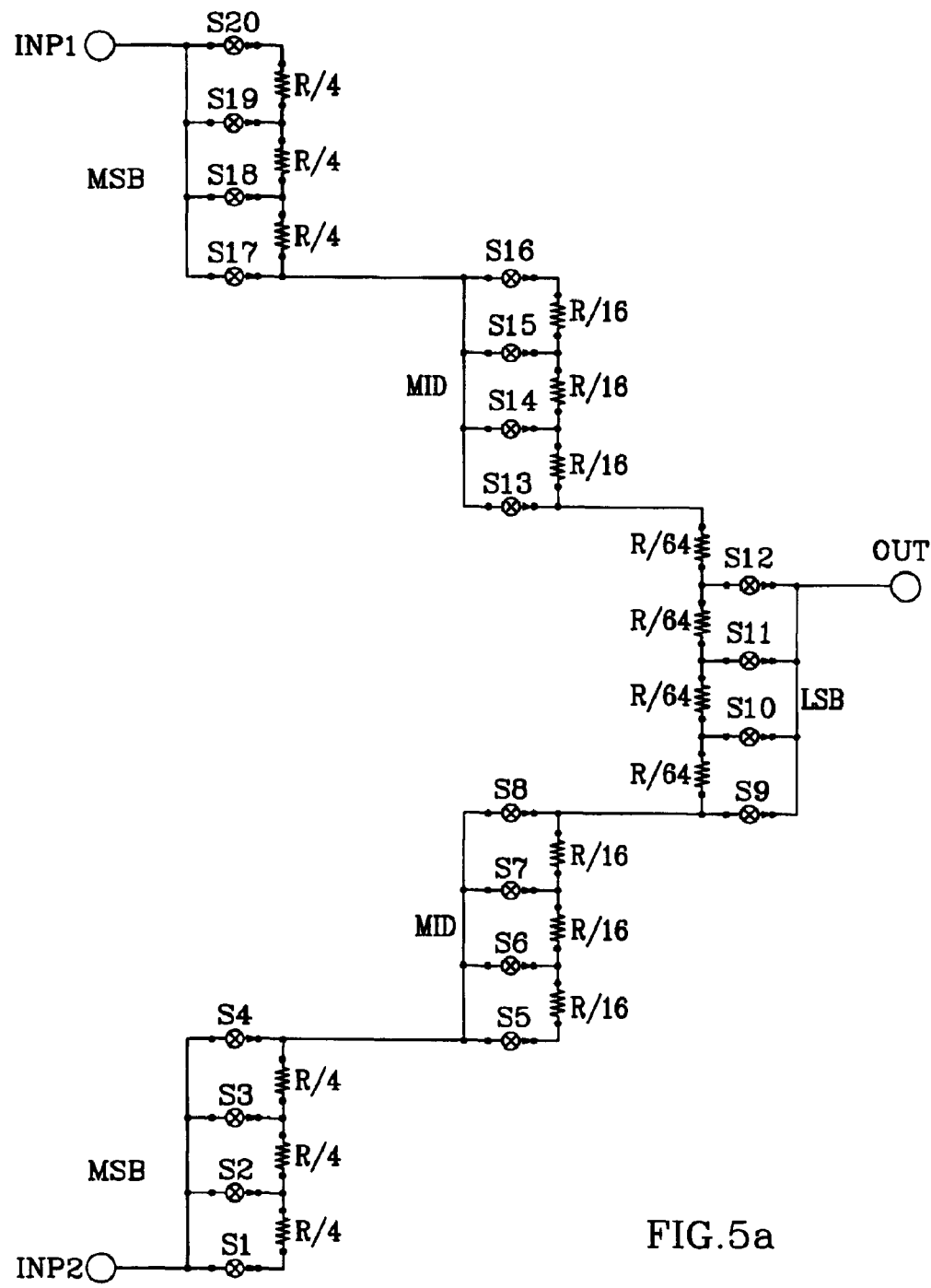
Figure 5B:
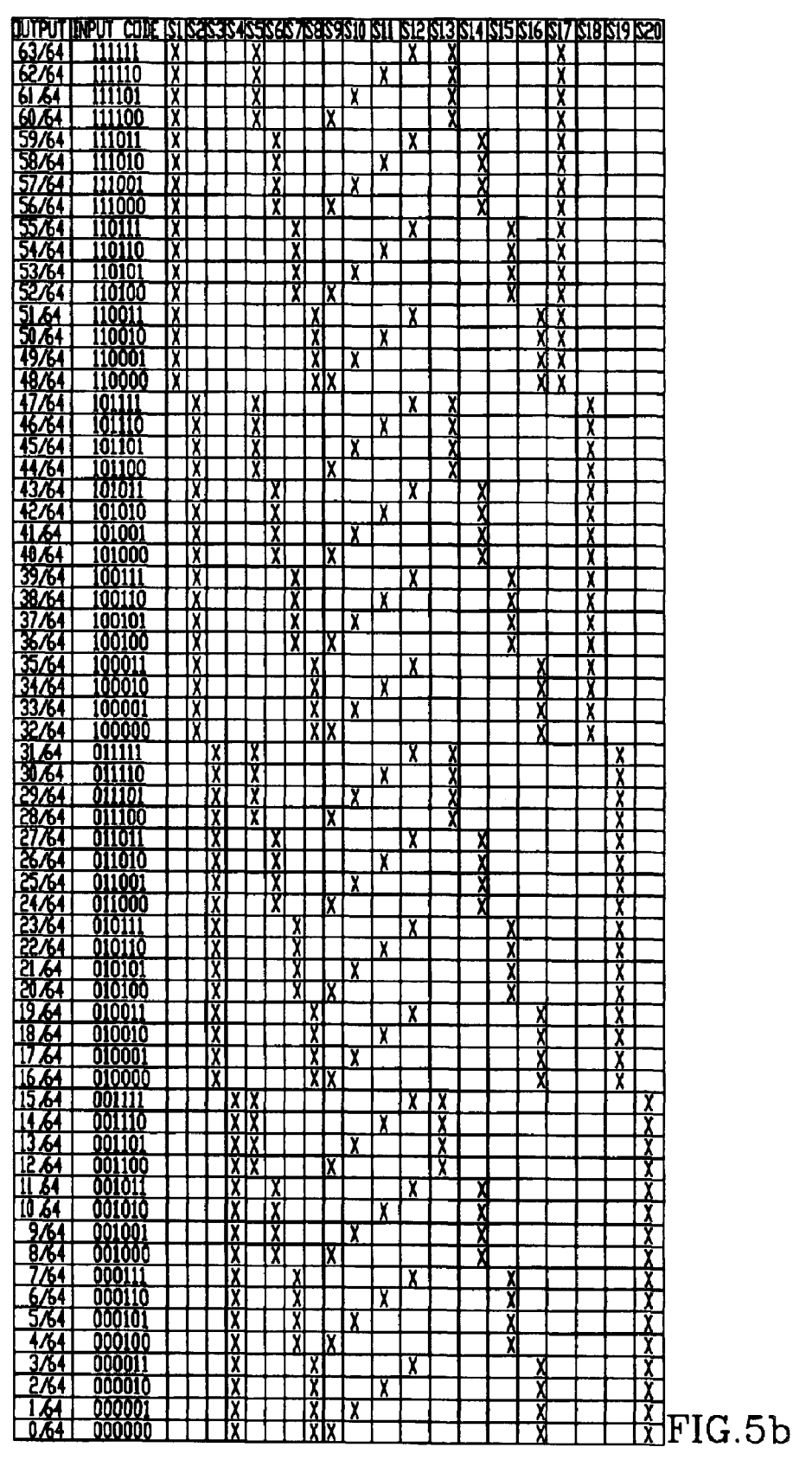

As noted above, for type A stages, a stage's switches may be on either the input or output side of its string. For example, in PIG. Sa, the middle stage's switches are located on the input side of the strings, as opposed to the output side as in FIG. 3a. Though this change does affect the switch operation chart (see FIG. 5b), it does not affect the functionality of the digitally-switched impedance.

Figure 6A:
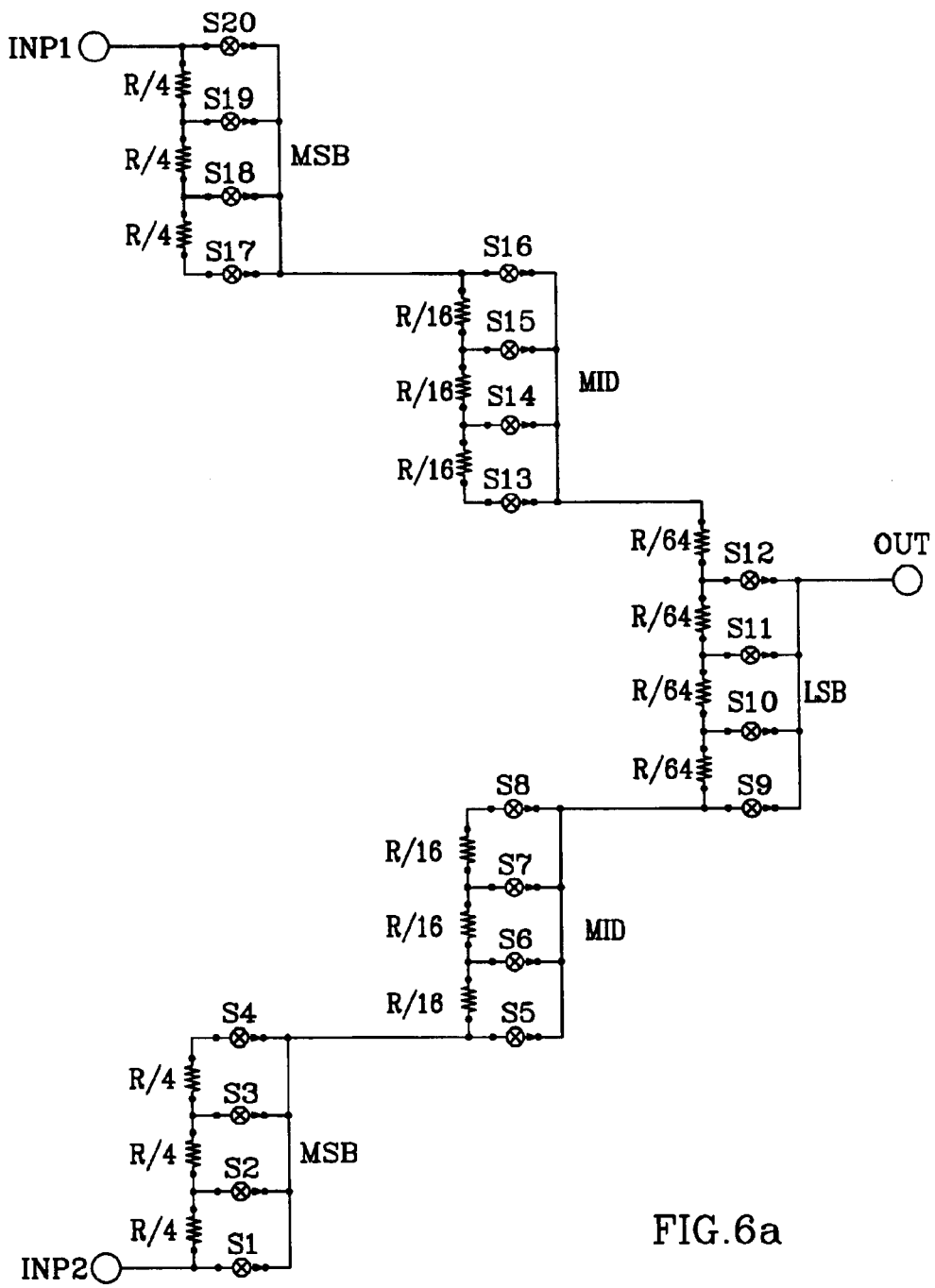
Figure 6B:
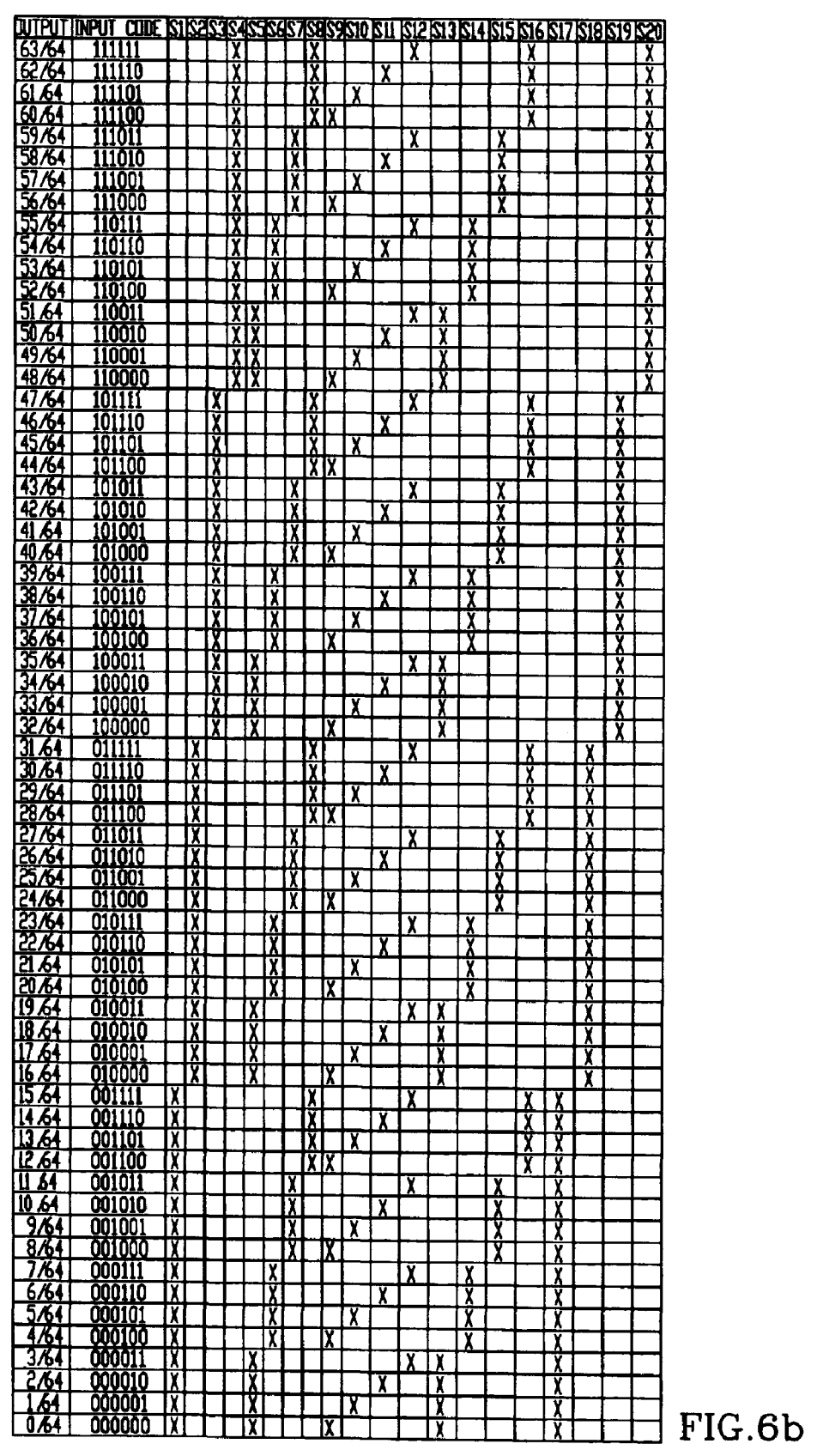

Similarly, in FIG. Ga, the MSB stage's switches are located on the output side of the strings, as opposed to the input side as in FIG. 3a. This also affects the switch operation chart (see FIG. 6b), but not the functionality of the digitally-switched impedance.

Figure 7A:
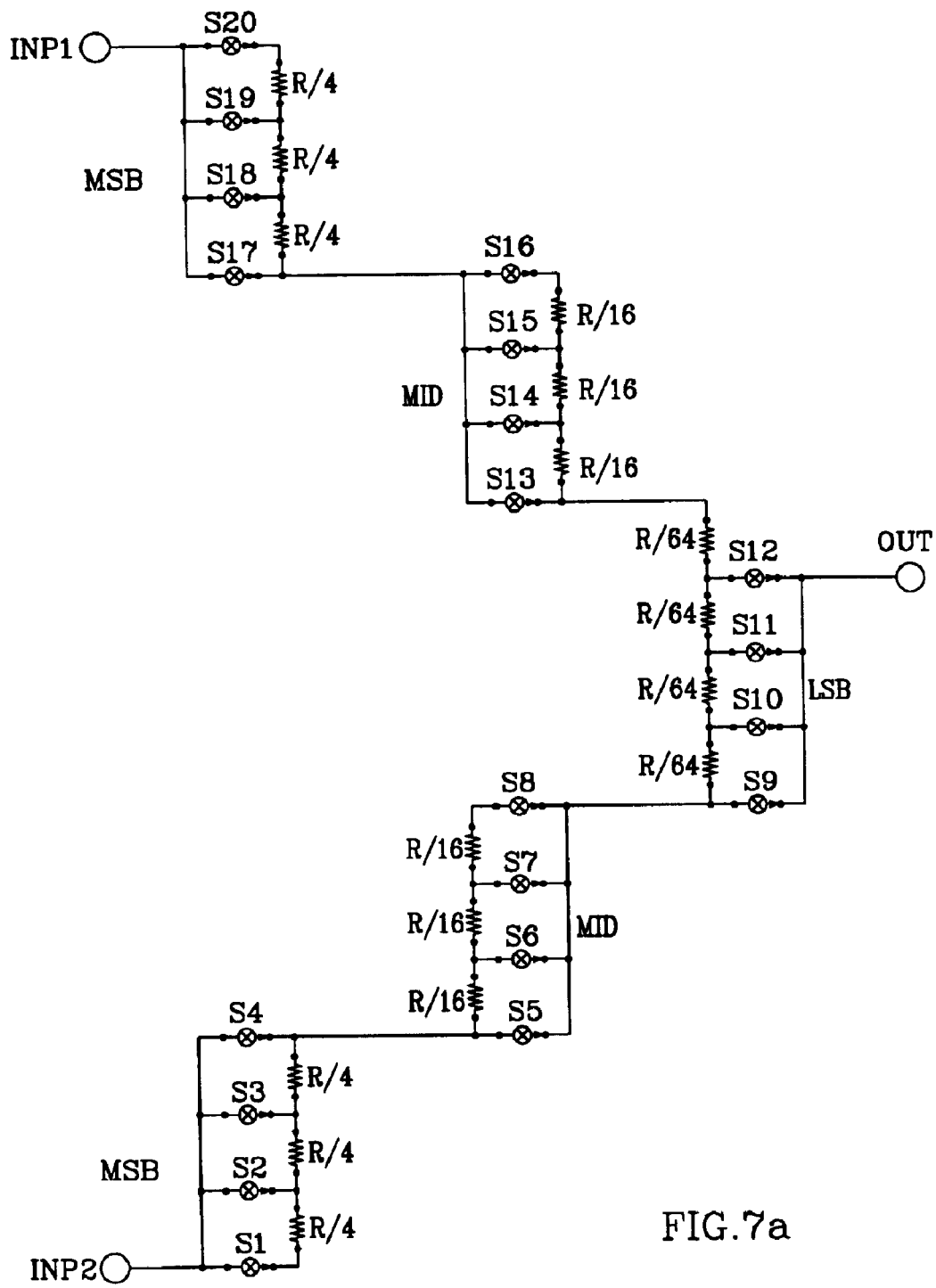
Figure 7B:
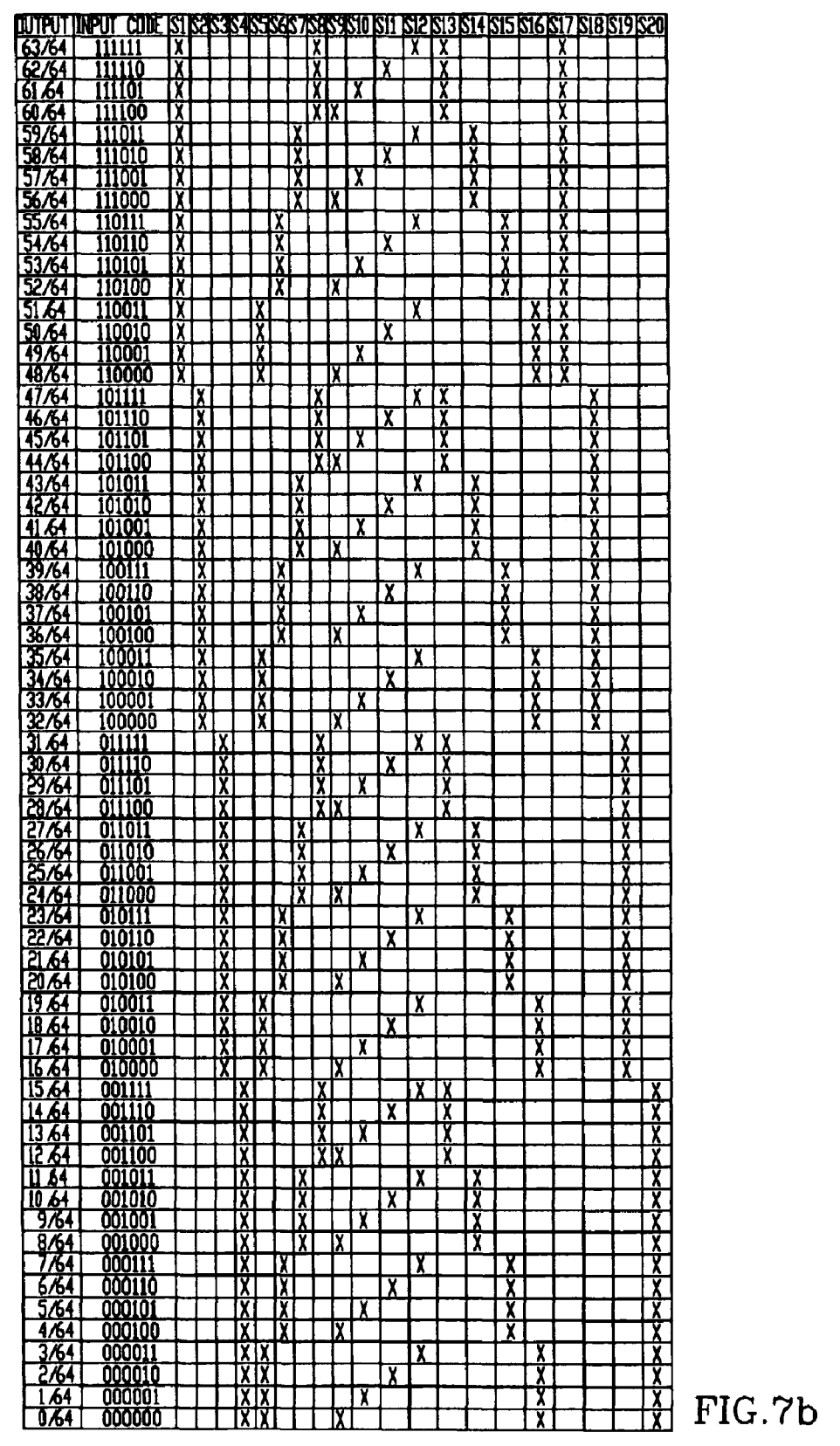

FIG. 7a illustrates how the switches on an upper and lower stage of a middle stage can be on opposite sides of their respective strings. This affects the switch operation chart (see FIG. 7b), but not the functionality of the digitally-switched impedance. This holds true whether the middle stage provides MSBs, LSBs, or middle bits of resolution.

Figure 8A:
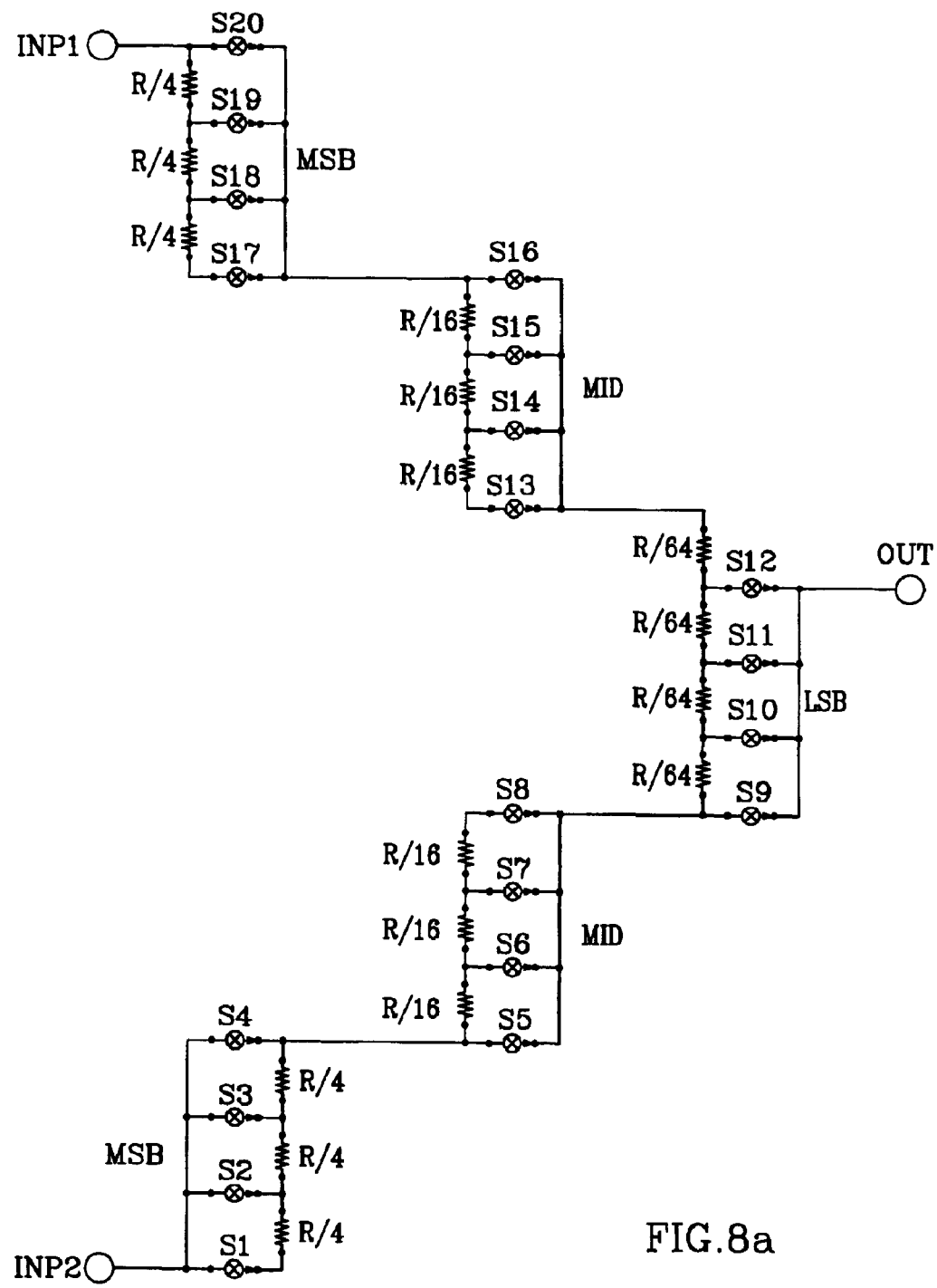
Figure 8B:
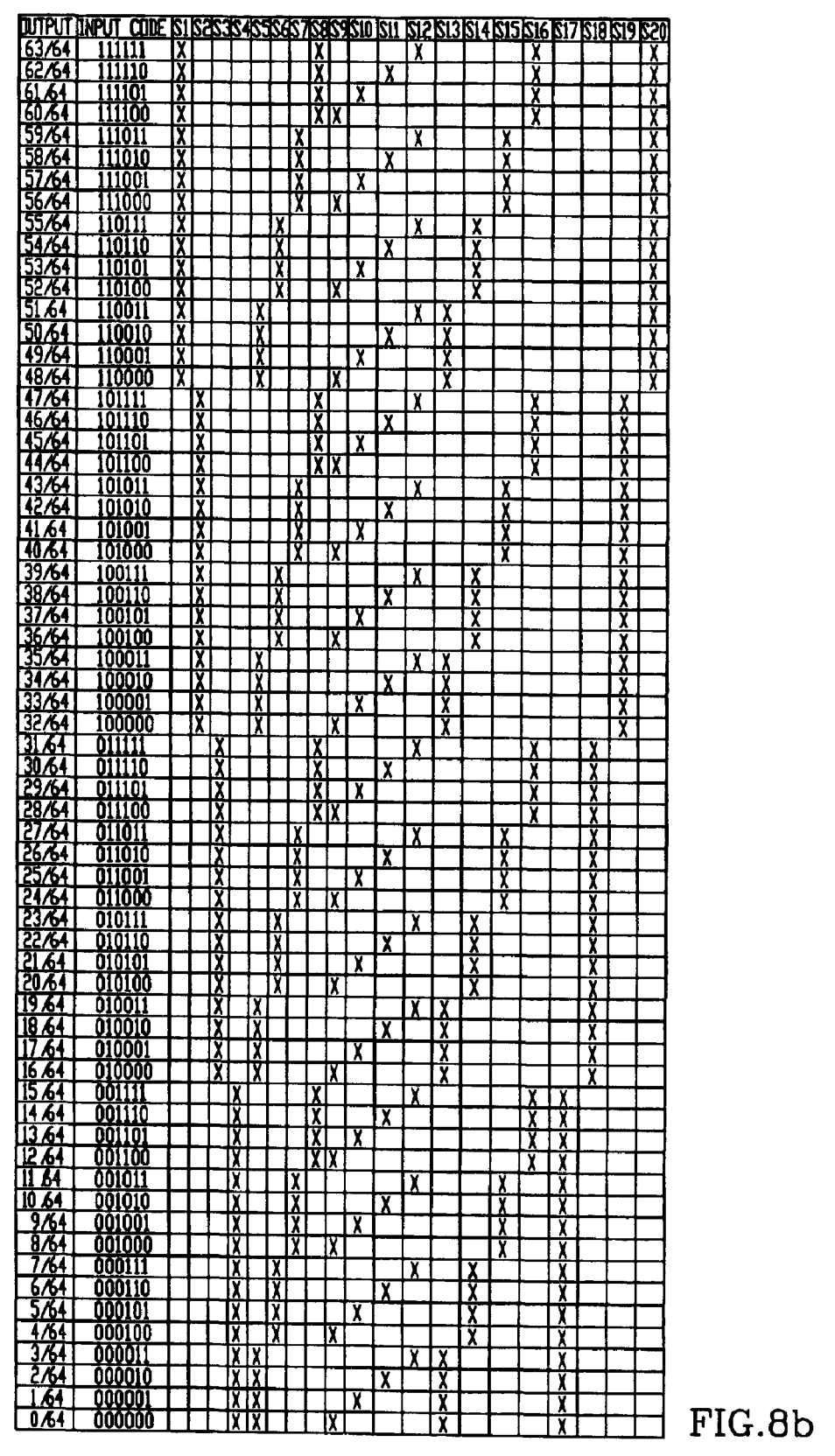

FIG. 8a illustrates how the switches on an upper and lower stage of the first type A stage (i.e., the stage connected to INP1 and INP2) can be on opposite sides of their respective strings. This affects the switch operation chart (see FIG. 8b), but not the functionality of the digitally-switched impedance. This holds true whether the first type A stage provides MSBs, LSBs, or middle bits of resolution.

Figure 9A:
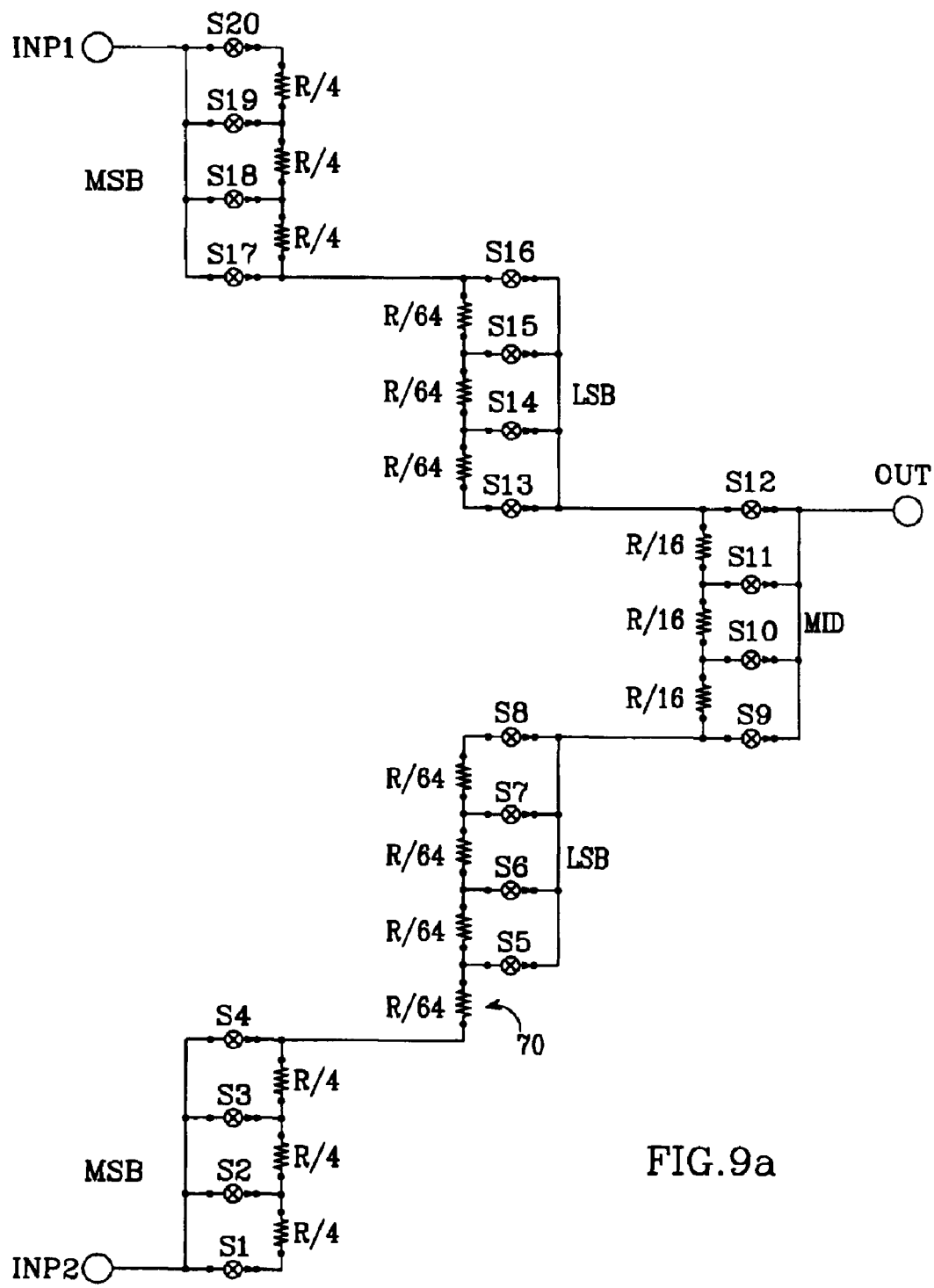
Figure 9B:
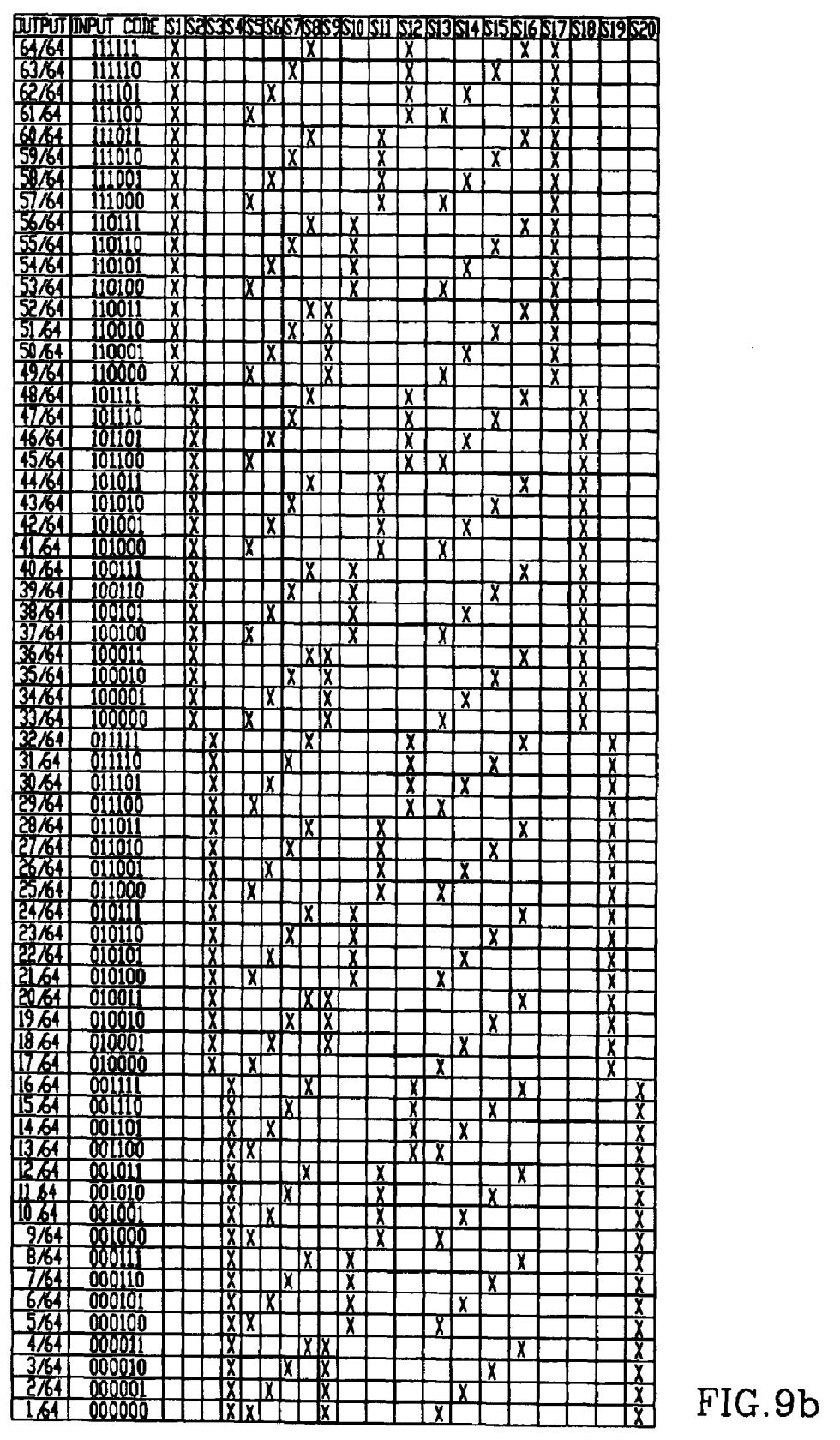

It is not required that the MSB stage be connected to INP1 and INP2, or that the LSB stage be the last, type B stage. For example, FIG. 9a illustrates an embodiment of a digitally-switched impedance in which the LSB stage is a type A middle stage, with the type B stage providing the middle bits of resolution. The type B stage has 3 resistors instead of 4, and has switches connected to each terminal of its resistor string. The type A middle stage has 3 resistors in its upper stage and 4 in its lower stage, one of which does not have a switch connected to one of its terminals. This "extra" resistor (70) is responsible for a 1 LSB zero-scale offset in the output characteristic. As with the previously-described embodiments, the embodiment shown in FIG. 9a provides a nearly constant resistance between INP1 and INP2. An operation chart for the digitally-switched impedance in FIG. 9a is shown in FIG. 9b. Note that connecting an additional switch between the open terminal of extra resistor 70 and the stage's output node eliminates the zero-scale offset inherent in the FIG. 9a architecture; however, a digital input signal of at least 7 bits would be required to operate the resulting digitally-switched impedance.

Figure 10A:
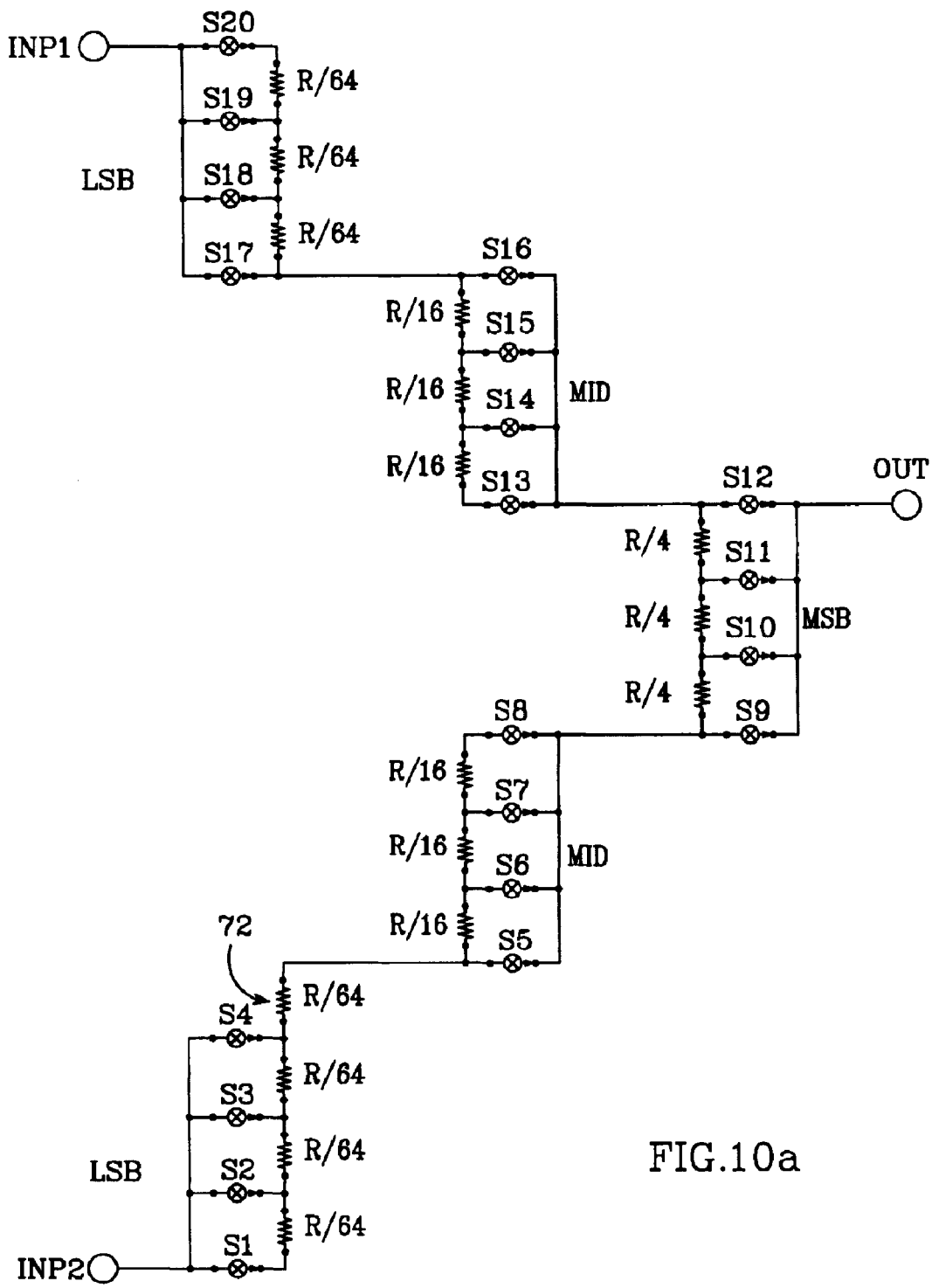
Figure 10B:
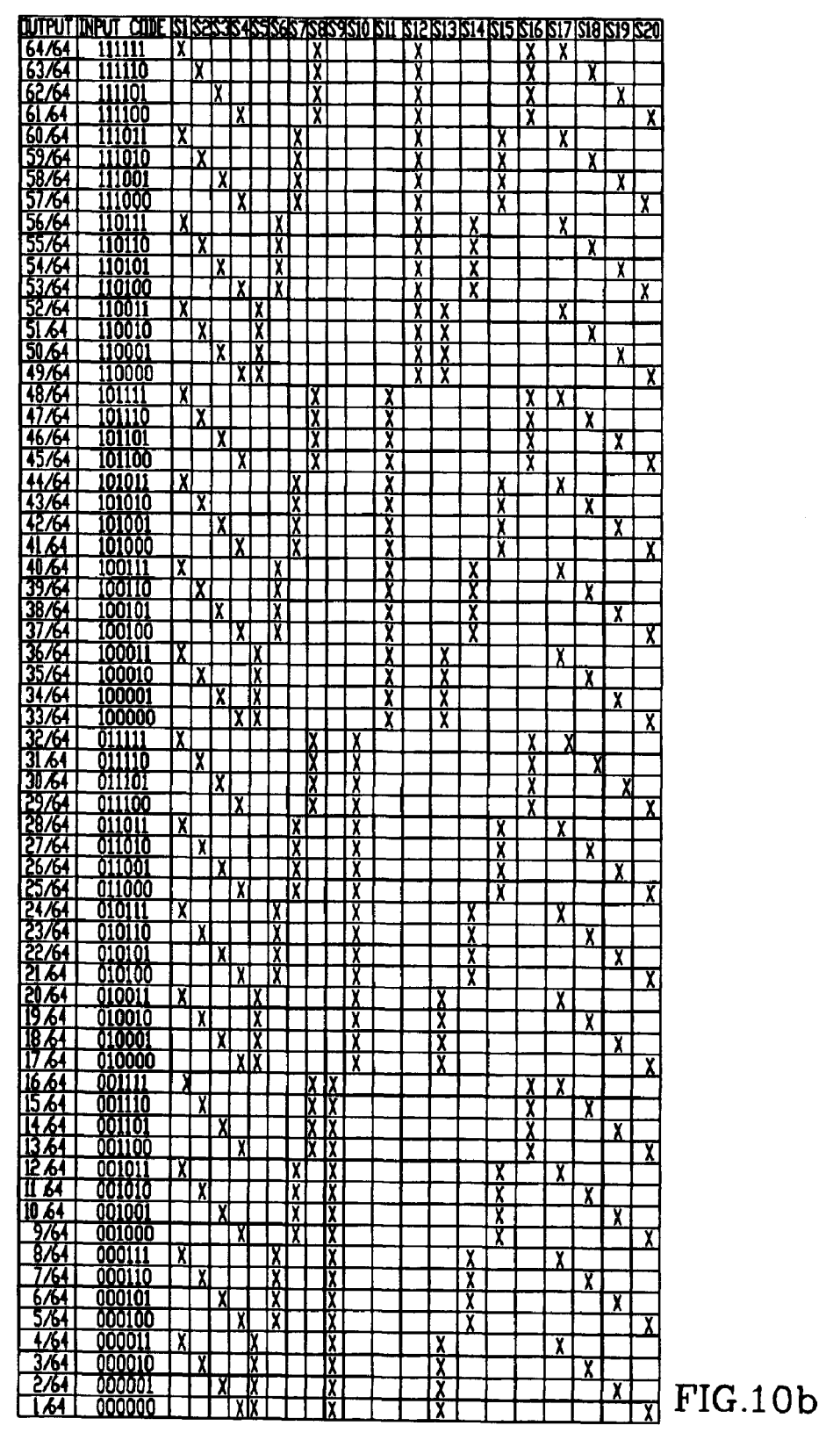
Figure 11A:
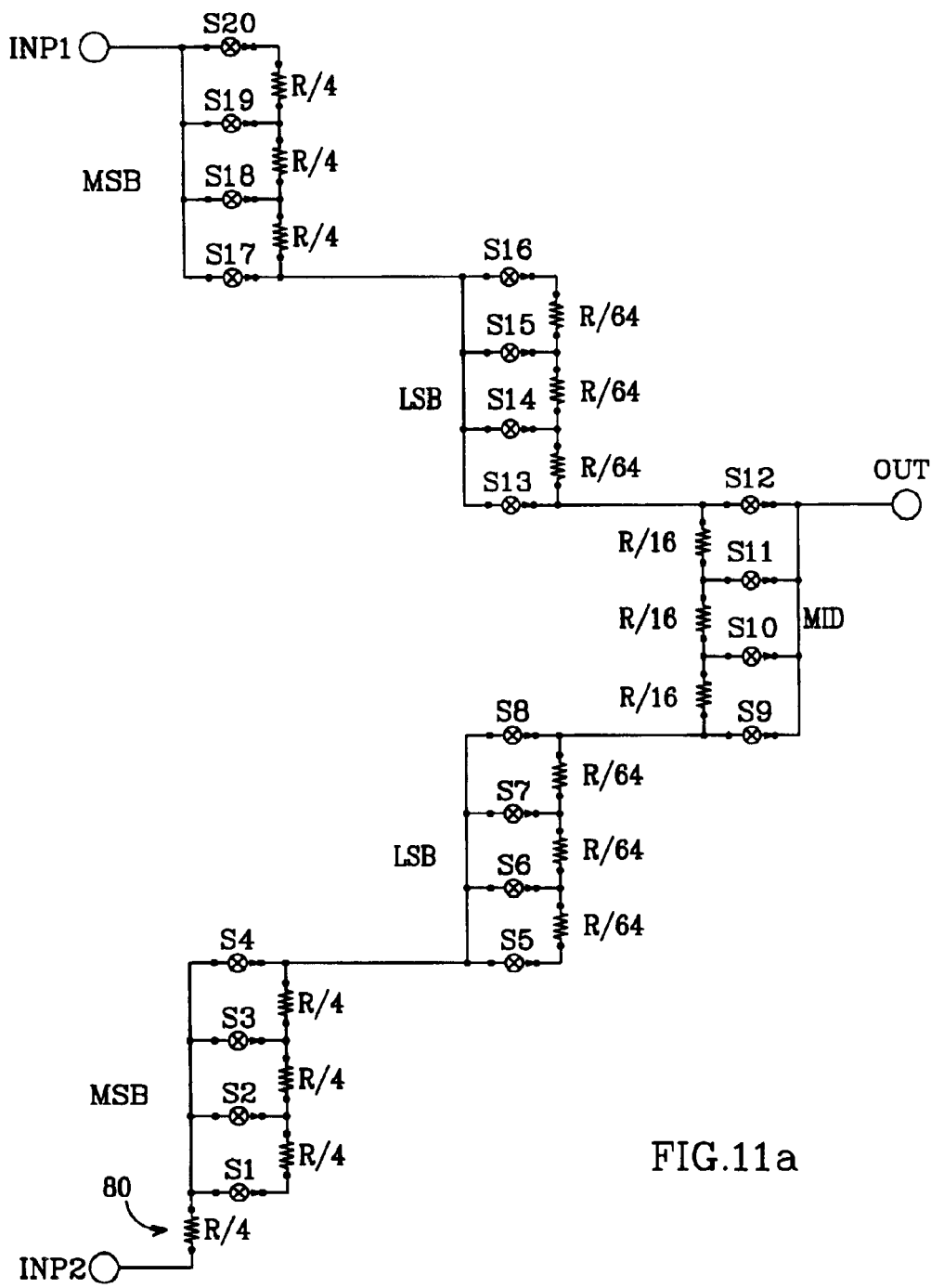

FIG. 11a illustrates an embodiment in which the LSBs are provided by a type A stage connected to INP1 and INP2, and the last, type B stage provides the MSBs. The type B stage has 3 resistors instead of 4, and has switches connected to each terminal of its resistor string. The type A first stage has 3 resistors in its upper stage and 4 in its lower stage, one of which does not have a switch connected to one of its terminals. This "extra" resistor (72) is responsible for a 1 LSB zero-scale offset in the output characteristic. As with the previously-described embodiments, the embodiment shown in FIG. 10a provides a nearly constant resistance between INP1 and INP2. An operation chart for the digitally-switched impedance in FIG. 10a is shown in FIG. 10b. Note that connecting an additional switch between the open terminal of extra resistor 72 and the stage's input node would eliminate the zero-scale offset inherent in the FIG. 10a architecture; a digital input signal of at least 7 bits would be required to operate the resulting digitally-switched impedance.

Figure 11B:
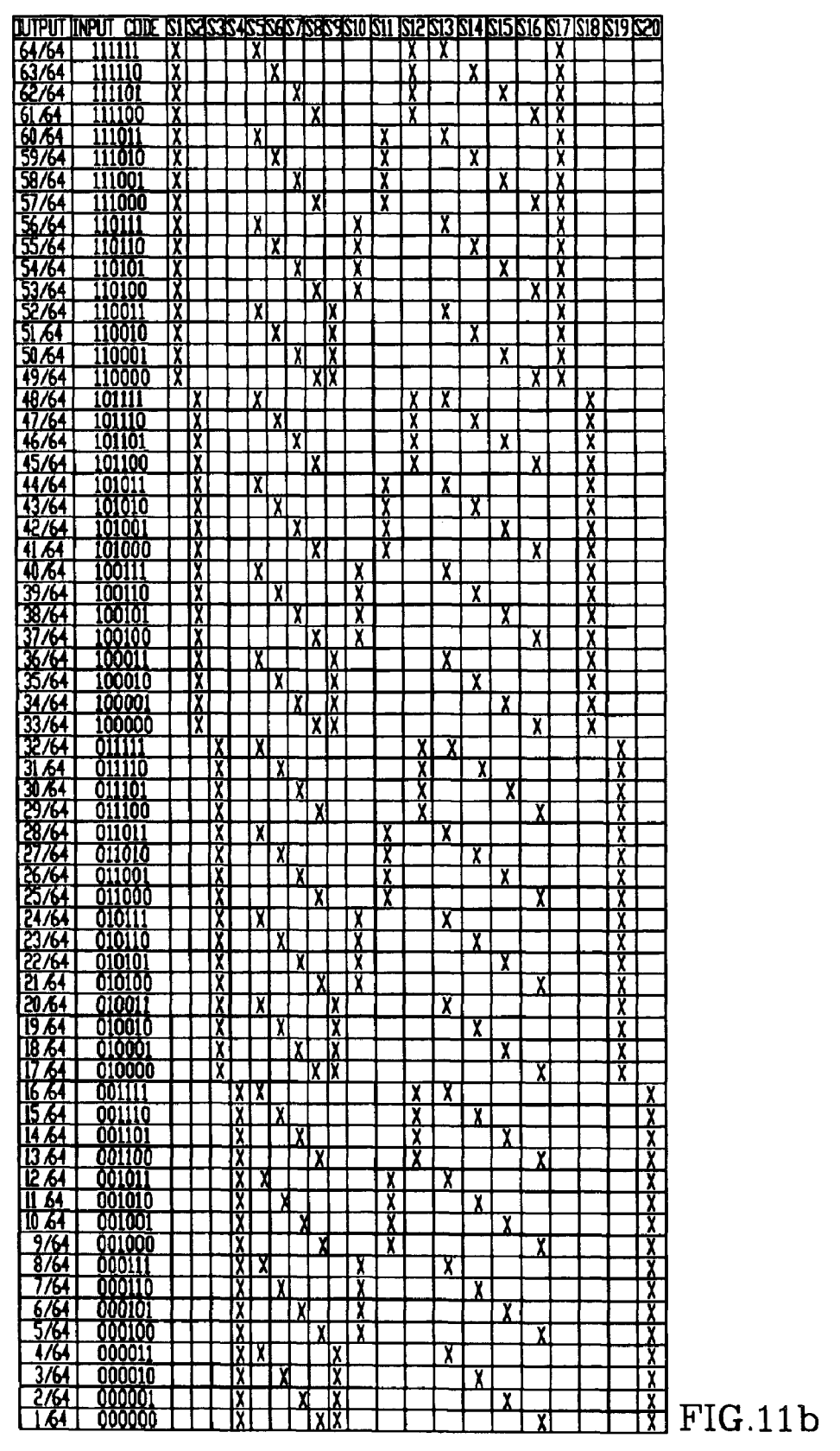

The location of the "extra" LSB resistor responsible for the zero or full-scale offset is flexible. That is, it can be grouped with any stage, as long as it is positioned above the OUT terminal for architectures with full-scale offsets, and below the OUT terminal for architectures with zero-scale offsets. For example, in FIG. 11a, the extra LSB resistor 80 is grouped with the lower stage of a type A MSB string. Referring to the corresponding operation chart in FIG. 11b, this implementation exhibits a zero-scale offset.

Figure 12A:
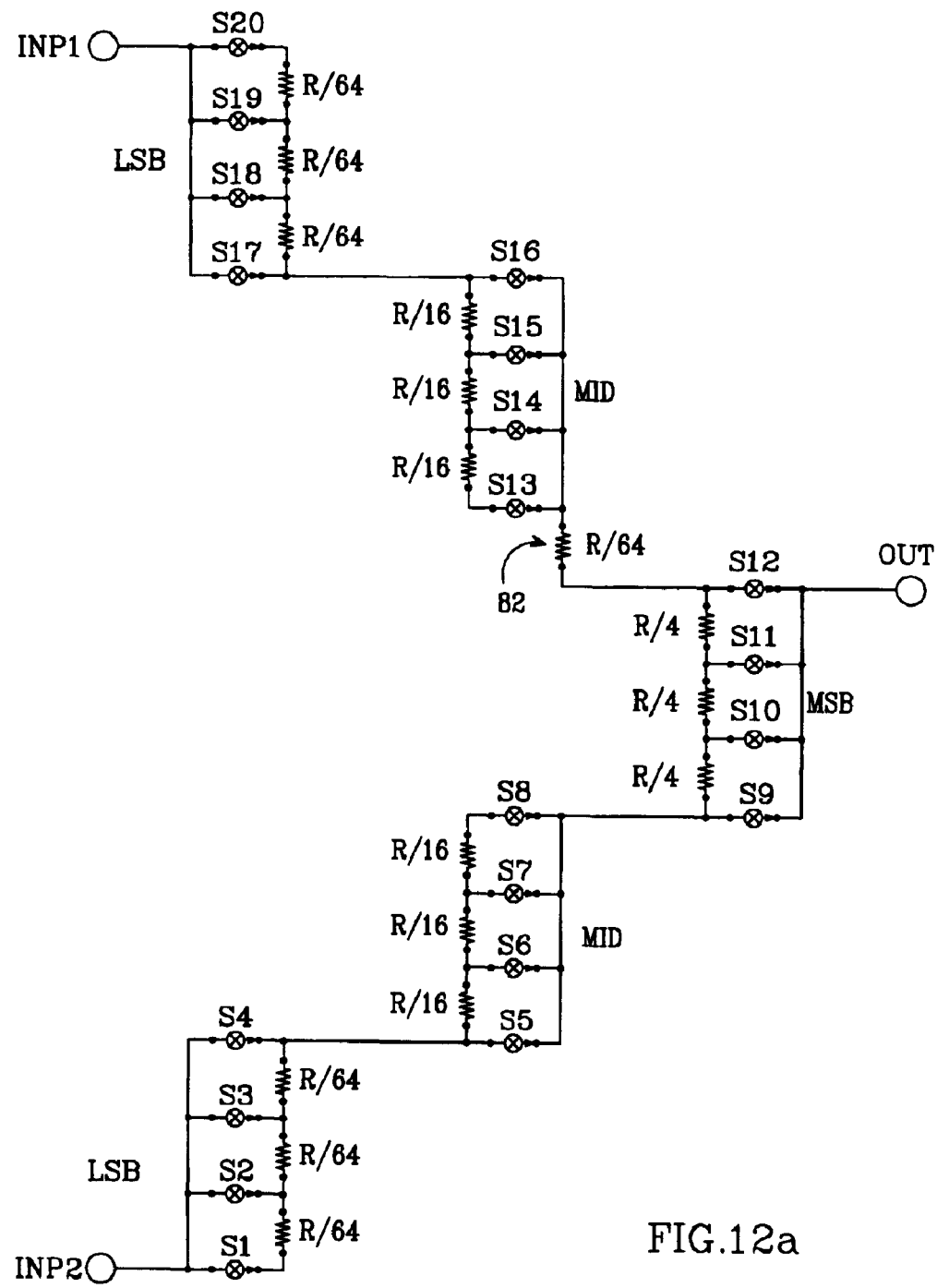
Figure 12B:
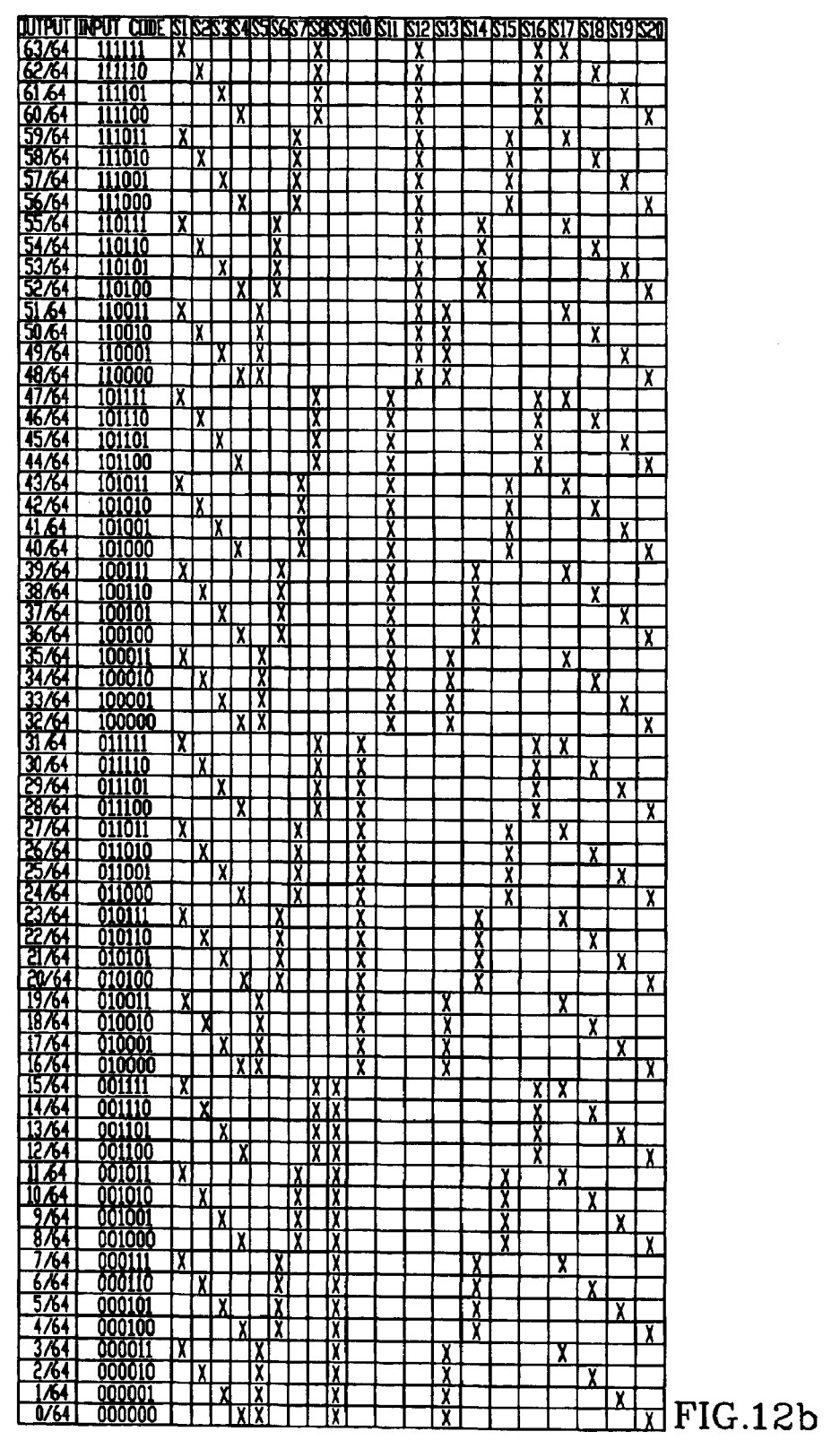

Similarly, in FIG. 12a, the extra LSB resistor 82 is grouped with the upper stage of a type A middle string. Referring to the corresponding operation chart in FIG. 12b, this implementation exhibits a full-scale offset.

Figure 13A:
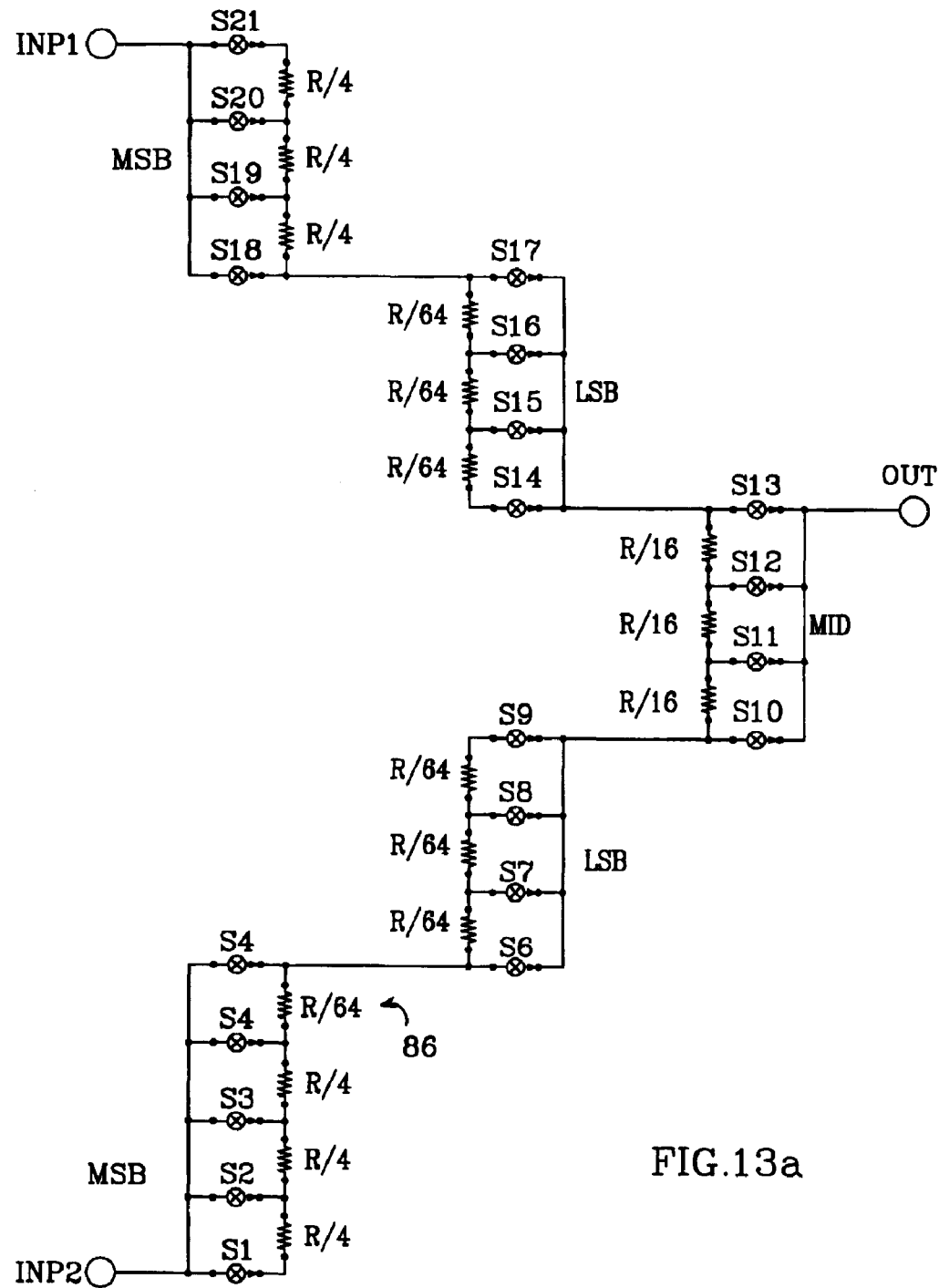
Figure 13B:
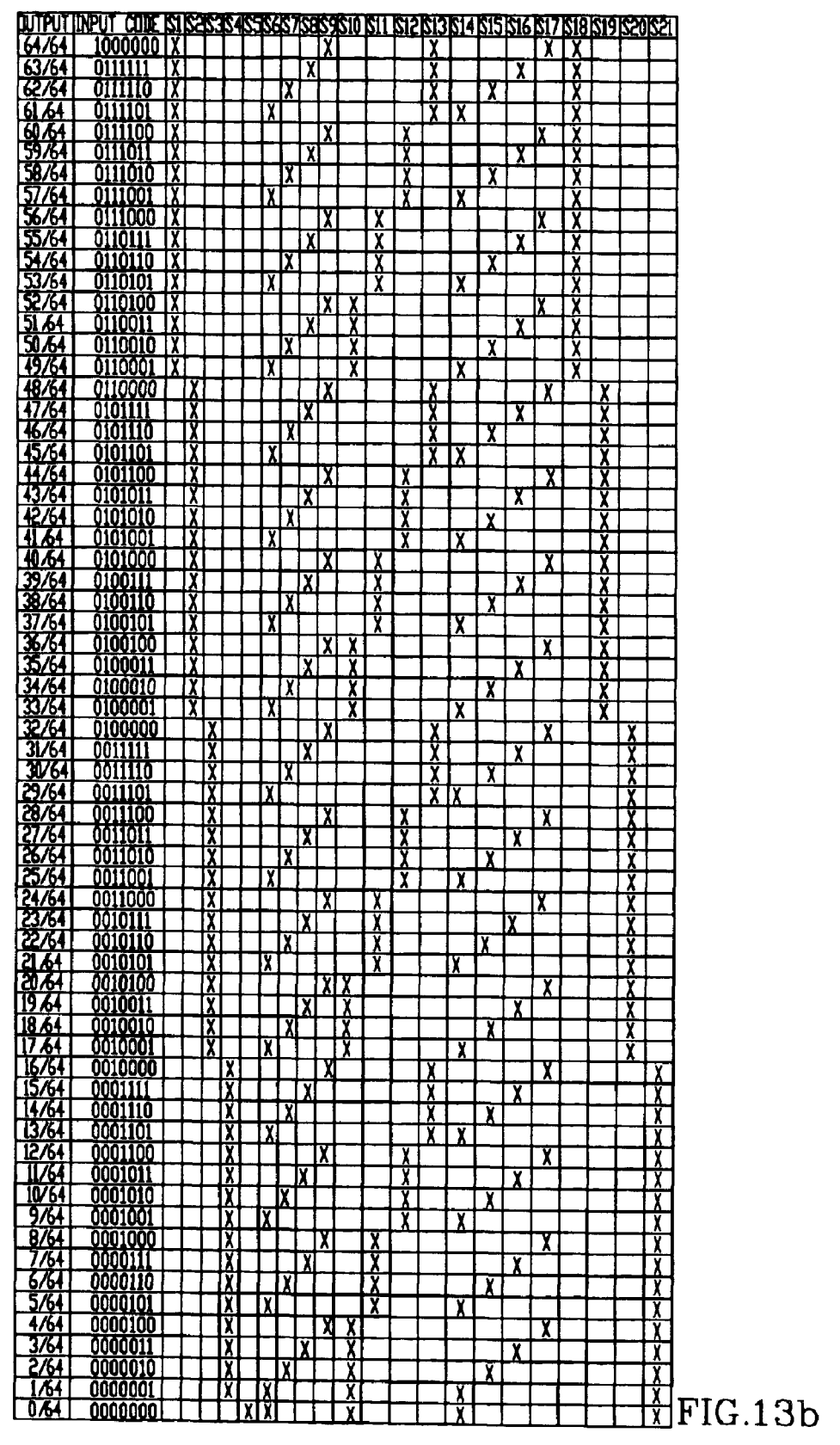

As before, the zero or full-scale offset can be eliminated by connecting a switch to the extra resistor's open terminal. This is illustrated in FIG. 13a. Here, the extra LSB resistor 86 is grouped with a type A MSB string, but an extra switch (5) has been added to connect the upper terminal of resistor 86 to INP2. This eliminates the zero-scale offset that would otherwise be present, but requires the use of a digital input signal with at least 7 bits. The corresponding operation chart is shown in FIG. 13b.

Note that the implementations shown in FIGS. 11a–13a illustrate only three of the many possible multiple-stage digitally-switched impedance architectures where the extra LSB resistor is grouped with stages other than the LSB stage.

Figure 14A:
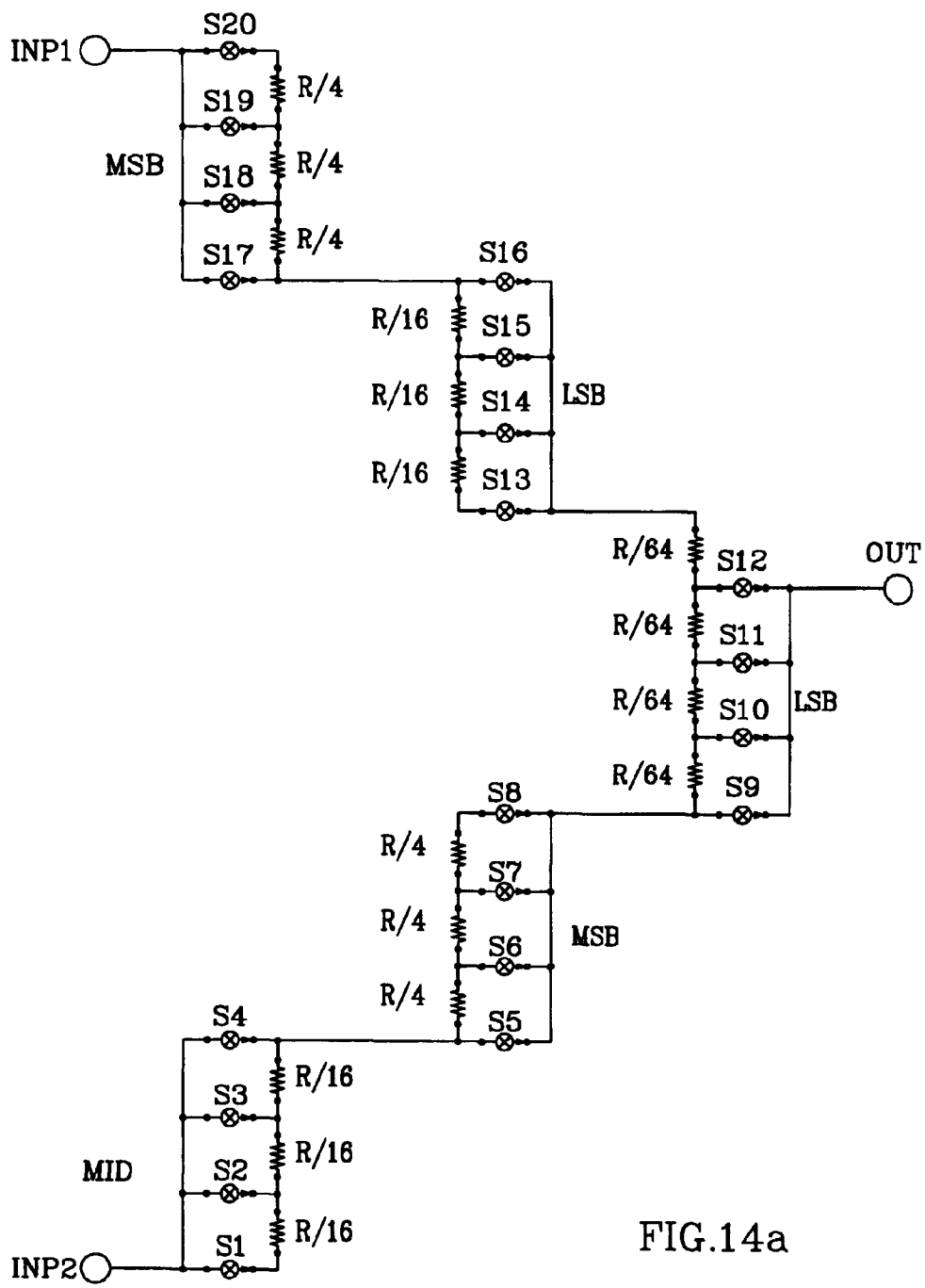
Figure 14B:
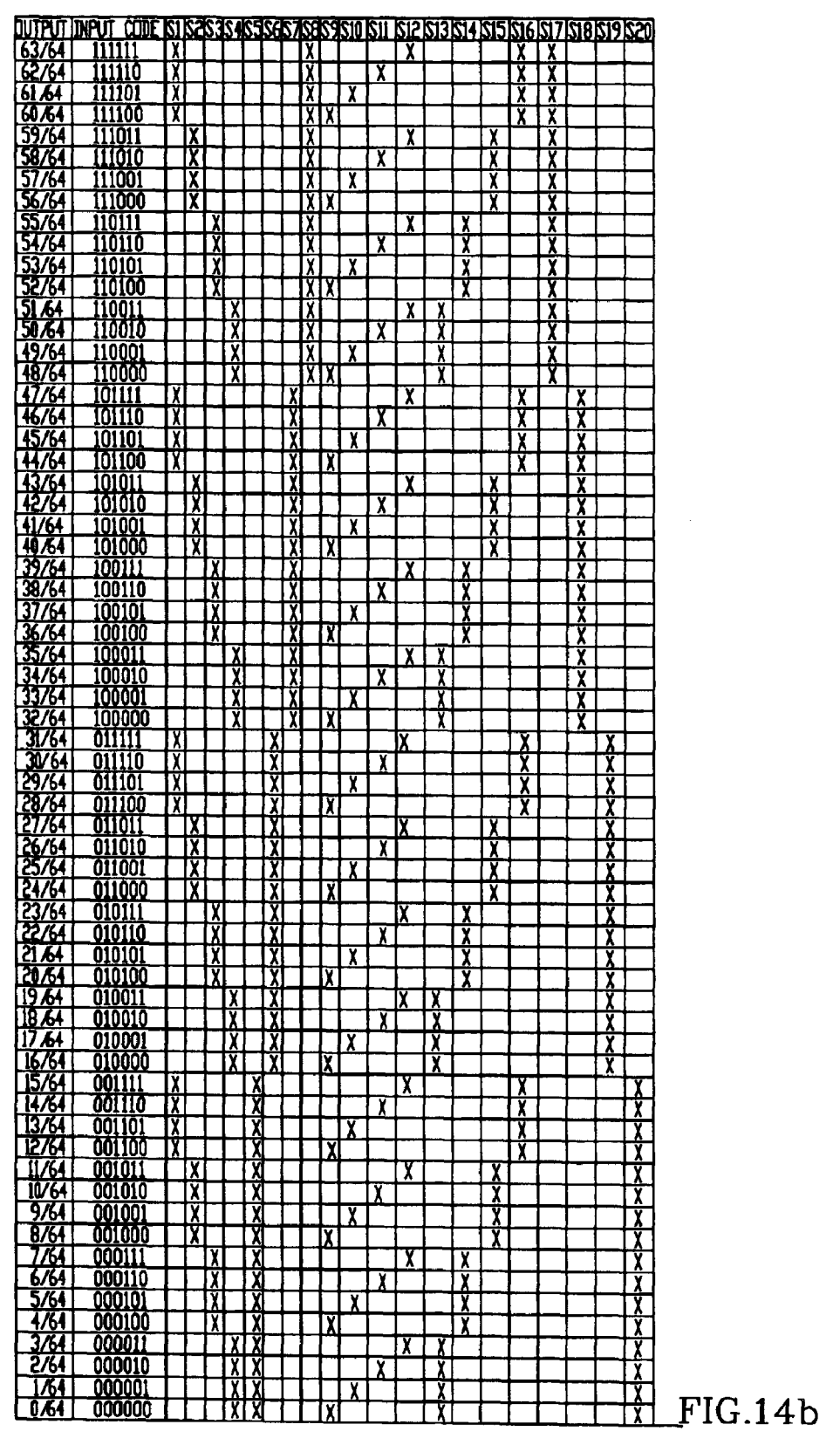

Additional flexibility for the present invention is illustrated in FIG. 14a, with a corresponding operation chart shown in FIG. 14b. This embodiment illustrates that the type A stages need not be in any particular order, and the order for the upper stages may differ from the lower stages, without affecting the operation of the digitally-switched impedance. Here, the upper stages are ordered MSB-MID between INP1 and the type B stage, while the lower stages are ordered MID-MSB between INP2 and the type B stage. The type A stages may be interchanged in this way as long as each type A upper stage (above OUT) has a corresponding lower stage (below OUT).

Figure 15A:
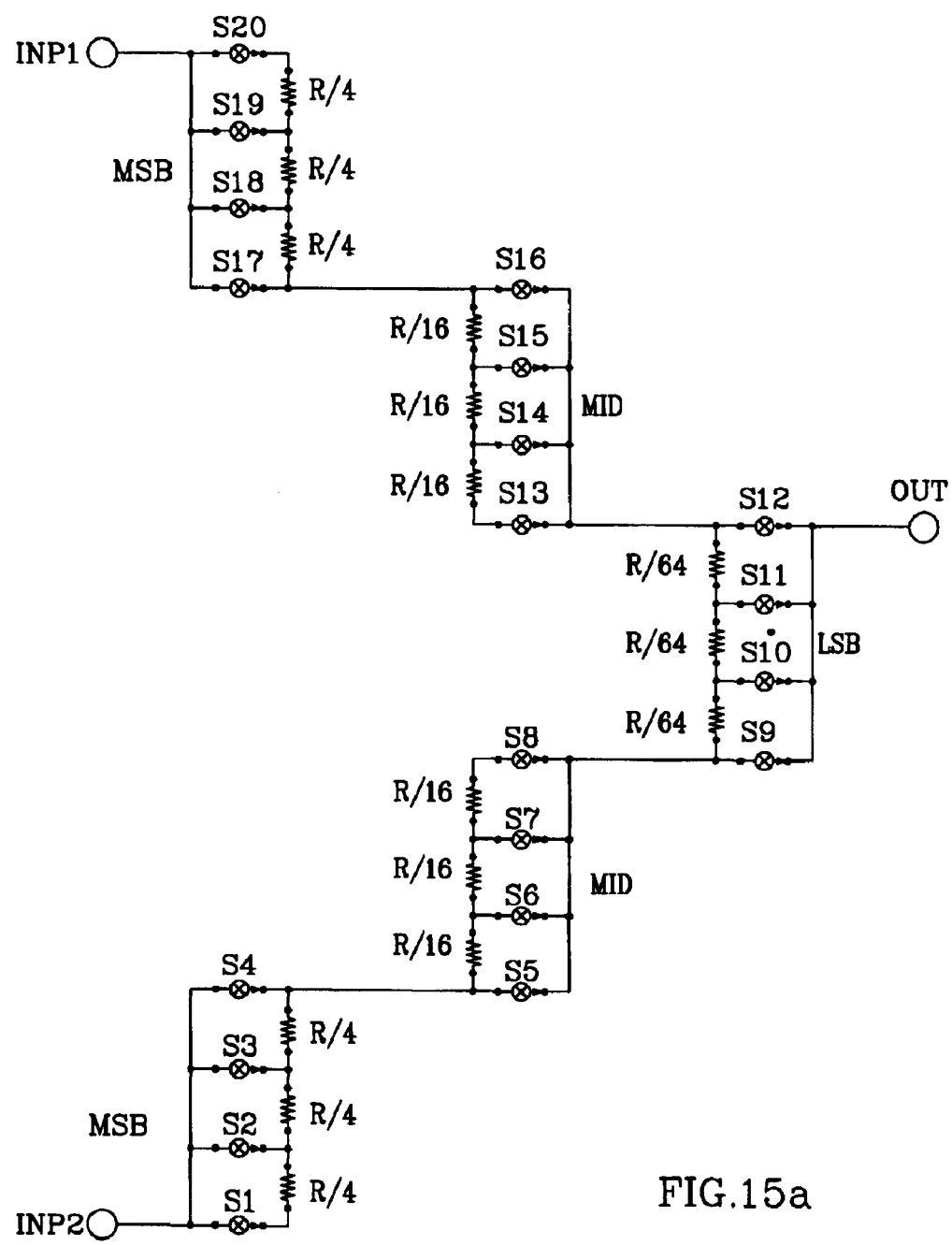
Figure 15B:
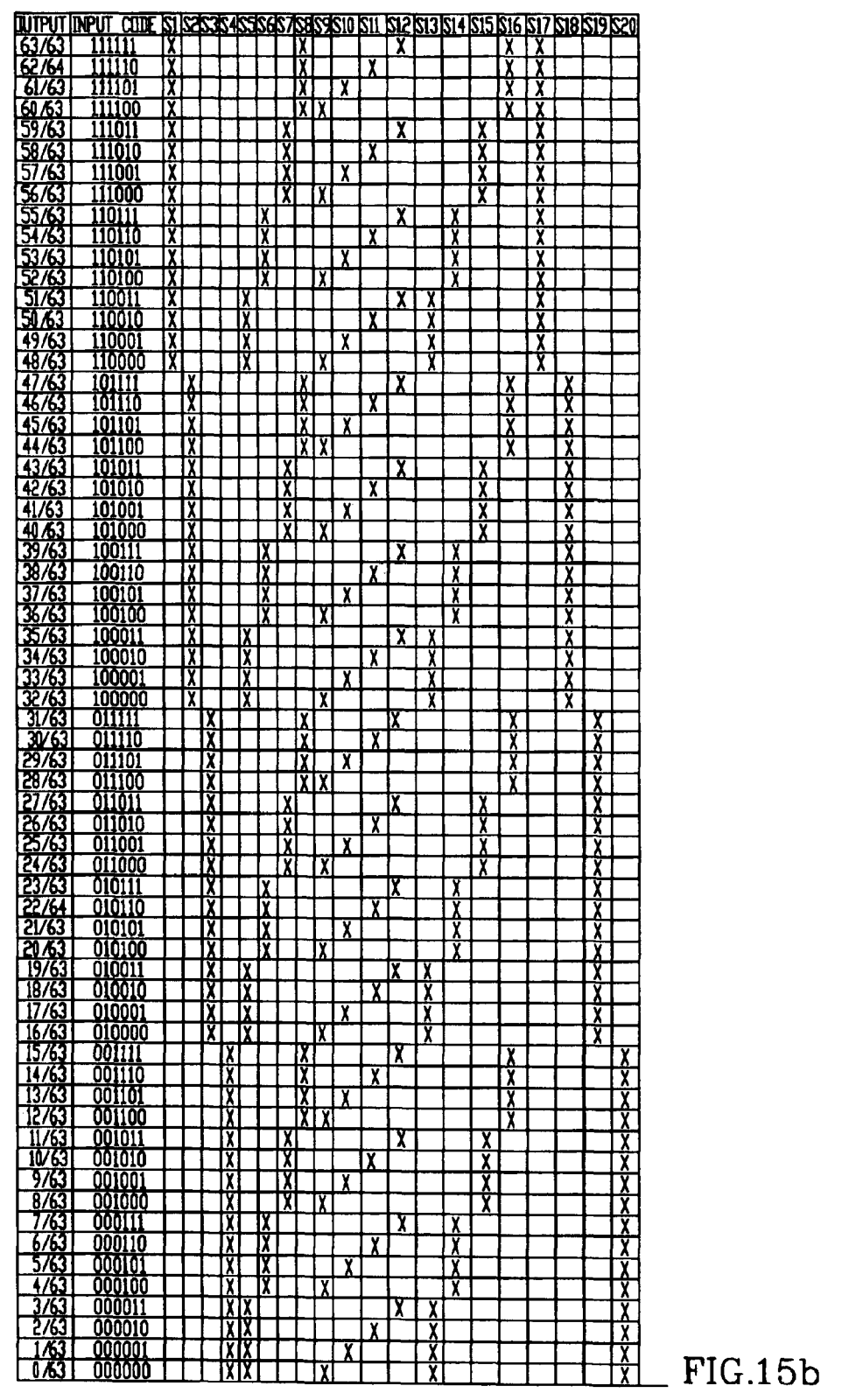

Another possible variation to the present invention is shown in FIG. 15a, with a corresponding operation chart shown in FIG. 15b. Here, rather than divide the resistor string into $2^n$ segments as described above, it is divided into $2^n-1$ segments. This is done by eliminating one of the LSB resistors, such that the number of series-connected impedances in the LSB stage is $2^m-1$, where m is the number of bits of resolution provided by the stage. For the 6-bit embodiment shown in FIG. 15a, the LSB stage provides 2 bits of resolution, and thus has $2^m-1=3$ resistors. As is seen from the operation chart in FIG. 15b, both zero and full-scale outputs are available, with no offsets. This arrangement provides a total end-to-end resistance of $(63/64)*R$ (instead of R as in the previously-discussed embodiments). Zero-scale and full-scale are thus $(0/64)*R$ and $(63/64)*R$, respectively. The embodiment divides the full-scale of $(63/64)*R$ into 63 segments, in increments of $(1/64)*R$—which is equal to $(1/63)*$full-scale. As the embodiment offers 64 outputs, it can provide $(0/63)*$full-scale as well as $(63/63)*$full-scale outputs without offsets. Note that this approach of removing a LSB resistor to divide the resistor string into $2^n-1$ segments is also applicable to type A stages that serve as LSB stages.

It should also be noted that the implementations shown in FIGS. 3a–16a are merely exemplary. It is understood that numerous variations and permutations of the illustrated architectures could be conceived by those familiar with the technology, yet remain consistent with the invention.

Figure 16:
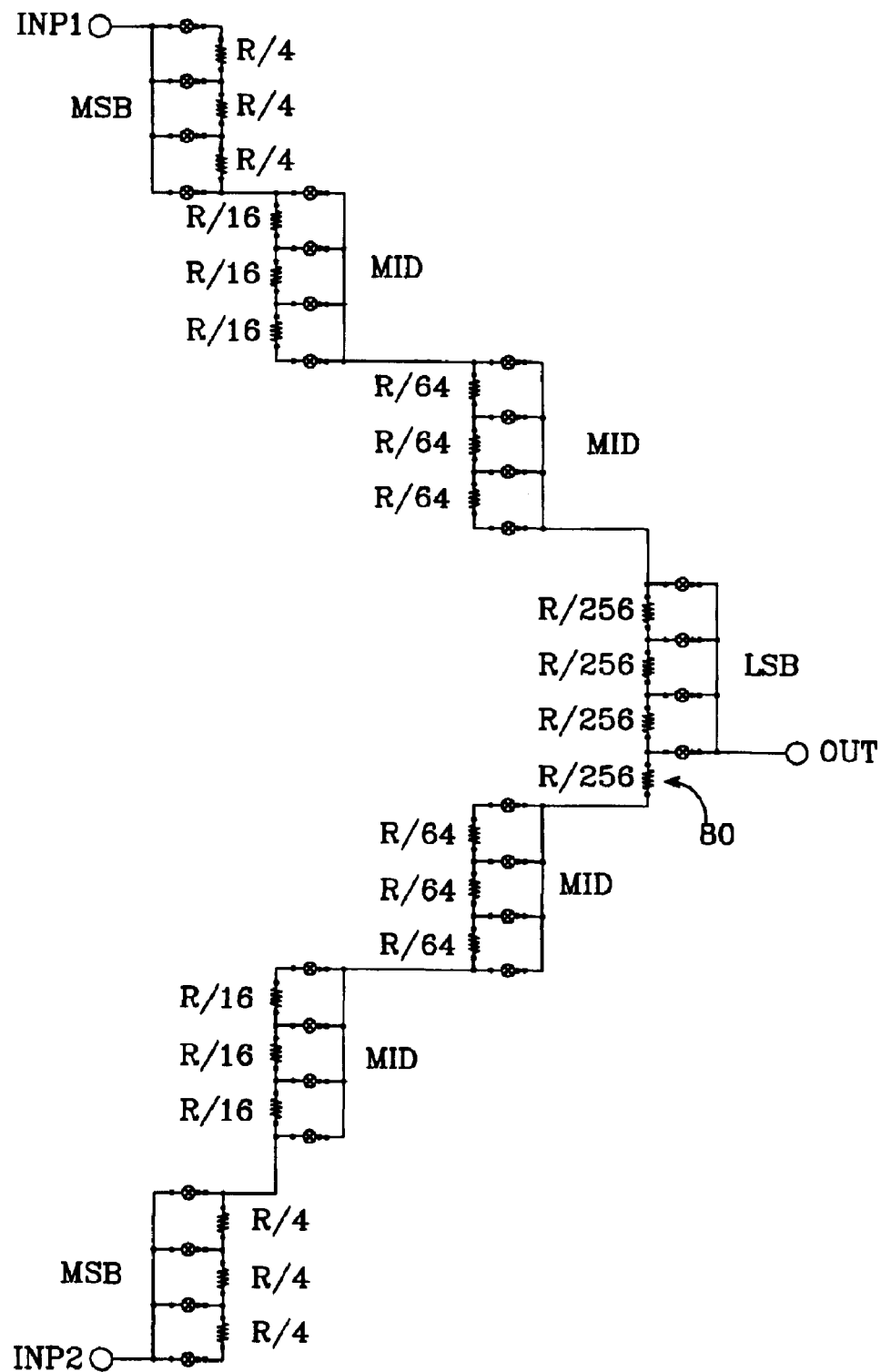
FIG. 16 is one possible embodiment of a 4-stage digitally-switched impedance per the present invention.

The invention is not limited to use with 3 stages: additional stages can be used to achieve higher resolutions, or to further reduce the circuit's component count; the maximum number of stages is equal to the total number of bits of resolution. One example is shown in FIG. 16, which depicts a 4-stage, 8-bit digitally-switched impedance. In this exemplary embodiment, each stage provides 2 bits of resolution. The type A MSB stage is connected to INP1 and INP2; each of its upper and lower stages has 3 resistors of value R/4, and 4 switches. There are two type A middle stages: the upper and lower stages of each has 3 resistors and 4 switches, with the resistors of the first middle stage having a value of R/16, and the resistors of the second middle stage having a value of R/64. The type B LSB stage has 4 switches and 4 resistors—including "extra" LSB resistor 80—each with a value of R/256. The switches could be operated to provide any of 256 possible outputs, with a zero-scale offset (when configured with resistor 80 at the bottom of the type B LSB stage). As before, the zero-scale offset could be eliminated with the addition of a switch between the open terminal of resistor 80 and OUT, along with a $9^{th}$ digital input signal bit.

The different configurations of impedances and switches shown in FIGS. 2b and 2c are applicable to architectures using more than three stages, as is the flexibility in locating the MSB, LSB and middle stages. It should also be noted that for all multiple-stage digitally-switched impedances contemplated by the invention, the MSBs, LSBs, and the middle bits of resolution may be located in any of the first, last, or middle stages, and there is no restriction on which portions of the total resolution are assigned to which stages.

Figure 17:
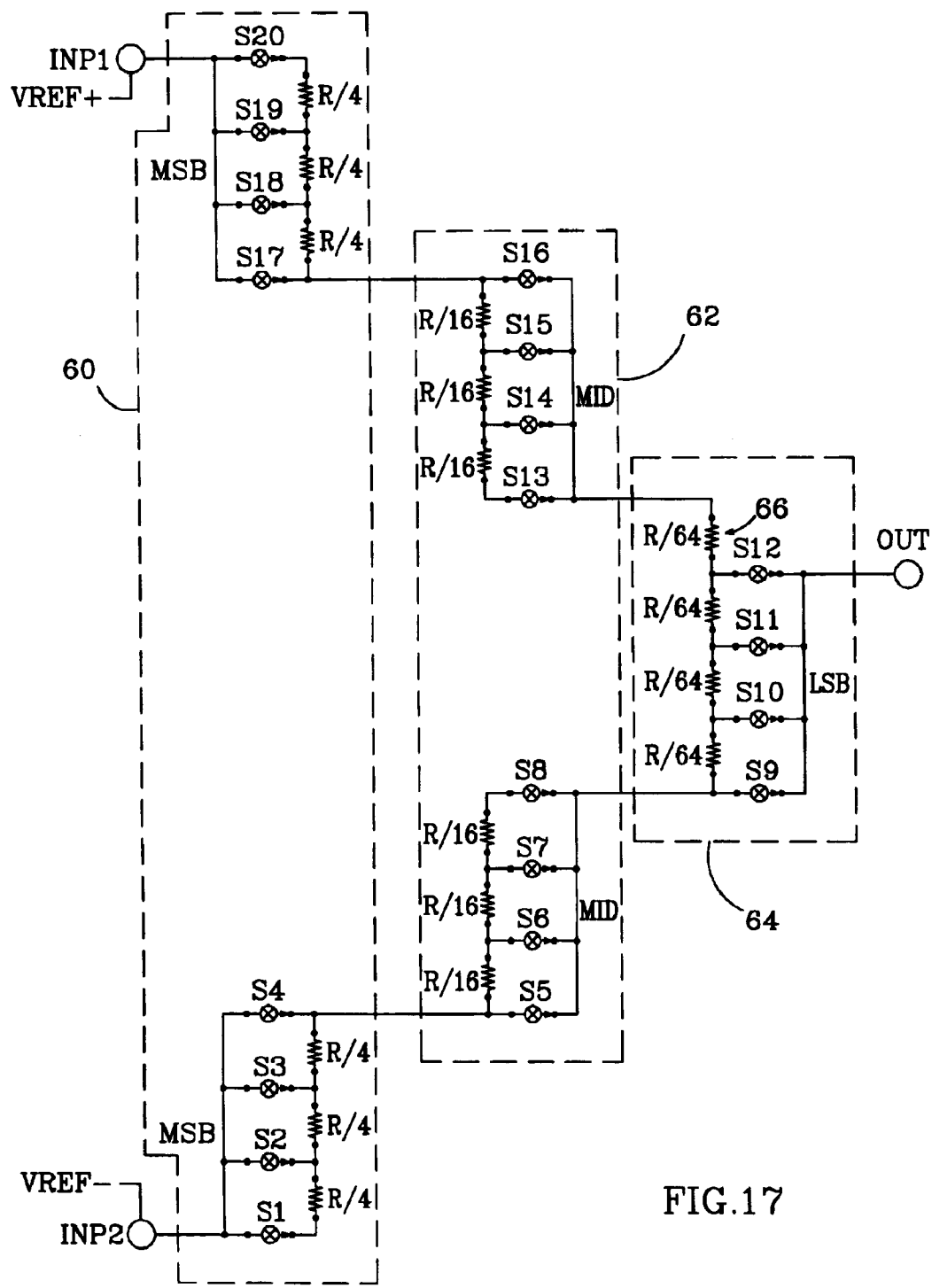
FIG. 17 is one possible embodiment of a resistive DAC made from a digitally-switched impedance per the present invention.

The present digitally-switched impedance uses passive switched taps and requires no buffer amplifiers; as such, it can be readily employed as a digital potentiometer or rheostat. The invention may also be suitably employed as a resistive DAC (rDAC), by connecting INP1 and INP2 to respective analog reference voltages. This is illustrated in FIG. 17, in which first and second reference voltages VREF+ and VREF– are connected to the INP1 and INP2 terminals, respectively, of the digitally-switched impedance shown in FIG. 3a. When so arranged, any of 64 possible analog output voltages may be provided at OUT when the switch networks are operated in accordance with the switch operation chart shown in FIG. 3b.

Note that the gain of the rDAC is easily adjusted by adding one or more resistors (not shown) to the inner string and/or the outer strings. For example, one variable resistor could be connected in series between VREF+ and the upper type A MSB stage, and one variable resistor could be connected in series between VREF– and the lower type A MSB stage; rDAC gain is adjusted using the variable resistors. Alternatively, rDAC gain can be adjusted by adding one or more resistors to the inner string. For example, one variable resistor could be connected in series between the upper MID type A stage and LSB stage 64, and one variable resistor could be connected in series between the lower MID type A stage and LSB stage 64; rDAC gain is adjusted using the variable resistors.

The present digitally-switched impedance can also be adapted for use as a variable resistor (or more generally, a variable impedance); this is illustrated in FIG. 18a. Here, there are only two terminals—IN and OUT. As such, the variable resistor does not require the use of upper and lower stage pairs. This embodiment operates in a similar fashion to the digital potentiometer discussed above, with each of the at least three stages providing a portion of the digitally-switched variable resistor's n-bit resolution, and with the sum of the bits of resolution provided by each stage equaling the total n-bit resolution. Here, each of the three stages contributes two bits of resolution to the total resolution of 6 bits. A decoder 100 receives a n-bit digital input signal and operates the switches as necessary to provide a desired resistance between the IN and OUT terminals.

The rules governing the number of resistors and switches and the resistor values required for a variable resistor implementation are as defined above. The exemplary embodiment shown in FIG. 18a, with 4 resistors and 5 switches in its LSB stage, provides a full scale output (assuming the use of a 7-bit input code). An alternative LSB stage for the variable resistor of FIG. 18a is shown in FIG. 18b. Here, only 3 resistors and 4 switches are employed; as such, a full-scale offset will be present (and only a 6-bit input code is required).

Another alternative LSB stage is shown in FIG. 18c. This illustrates that for a variable resistor implementation, it is no longer necessary that the last stage's switches be on the output side of its string. Here, there is no need to maintain a constant aggregate impedance between OUT and IN, as was the case for the digital potentiometer discussed above. Therefore, the last stage's switches may be on either side of its string without affecting functionality.

Figure 19:
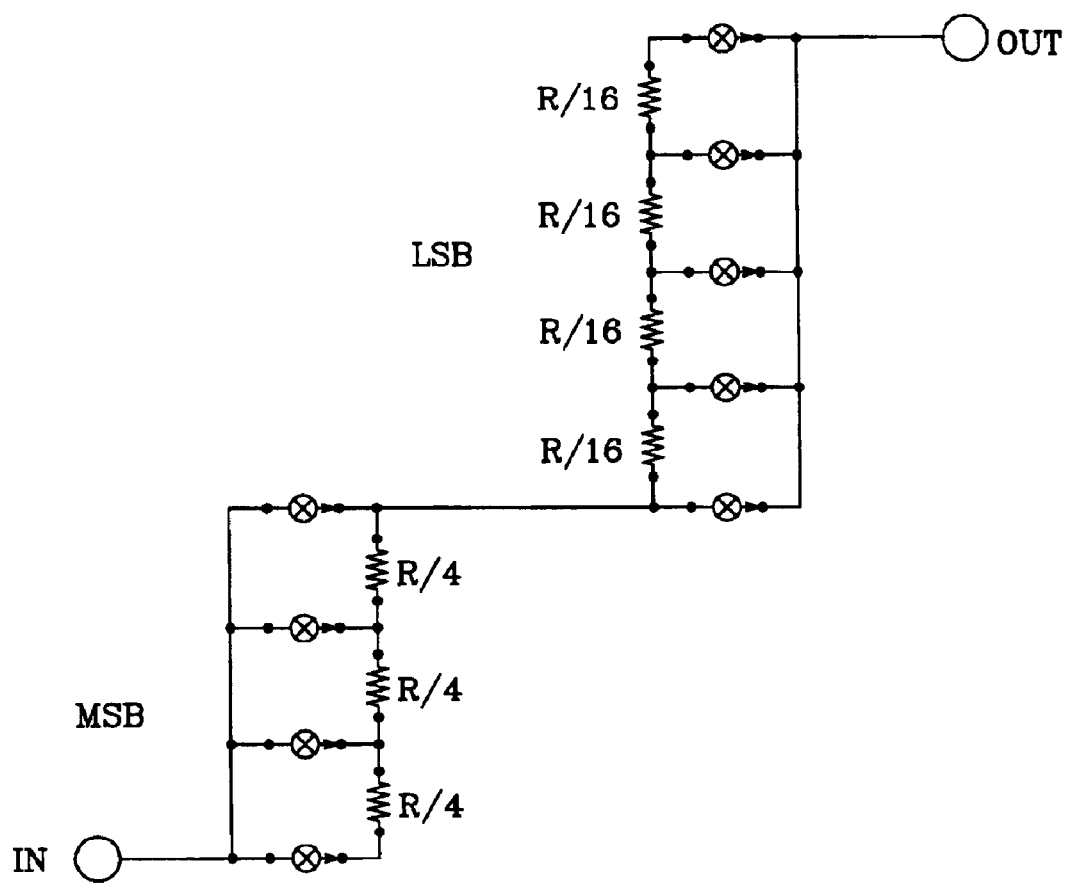
FIG. 19 is another embodiment of a digitally-switched impedance which functions as a variable resistor.

A variable resistor in accordance with the present invention can also be implemented with just two stages. An exemplary two-stage implementation is shown in FIG. 19.

It should be noted that all the variations discussed above in connection with the digital potentiometer are applicable here as well. For example, the MSB, LSB and middle resolution stages may be located as needed, and each stage's switches may be located on either the input or output side of its series-connected resistors.

While particular embodiments of the invention have been shown and described, numerous variations and alternate embodiments will occur to those skilled in the art. Accordingly, it is intended that the invention be limited only in terms of the appended claims.

We claim:

1. A digitally-switched impedance for an n-bit digital input signal, comprising:

high and low reference nodes;

one "type B" stage and at least two "type A" stages, each of said type A stages comprising an upper stage and a lower stage, each of which has an input node and an output node, and said type B stage having first and second input nodes and a final output node;

said type A stages coupled between said high and low reference nodes and said type B stage such that:
the upper and lower input nodes of a first type A stage are connected to said high and low reference nodes, respectively, and
the upper and lower output nodes of each type A stage are connected to the upper and lower input nodes, respectively, of a following type A stage, except for the last type A stage, the upper and lower output nodes of which are connected to the first and second input nodes, respectively, of said type B stage;

each of said upper and lower stages comprising:
a string of predetermined series-connected impedances, and
a switch network arranged to connect a selected number of said string's series-connected impedances between said stage's input node and output node;

said type B stage comprising:
a string of predetermined impedances series-connected between said first and second input nodes, and
a switch network connected to said string to provide a selectable tap from said string to said final output node; and a decoder which responds to an n-bit digital input signal by controlling said switch networks to switch selectable portions of the strings in said type A stages into a series connection with said type B stage's string, said decoder further controlling said type B stage's switch network to tap said type B stage's string at a location to provide a impedance corresponding to said n-bit digital input signal between said final output node and at least one of said high and low reference nodes, the selected portions having a substantially constant aggregate series impedance $Z_{total}$ between said high and low reference nodes over the switching ranges of said type A stages, the number and impedance values of the impedances in said stages arranged such that each stage provides a portion of the digitally-switched impedance's n-bit resolution and that the sum of the bits of resolution provided by each stage equals the total n-bit resolution.

2. The digitally-switched impedance of claim 1, wherein, for each type A or type B stage not providing the LSB portion of said digitally-switched impedance's n-bit resolution, the type B stage or each of the upper and lower stages of the type A stages comprises:

$2^m-1$ series-connected impedances having $2^m$ terminals, said stage's switch network comprising:

$2^m$ switches connected between respective ones of said $2^m$ terminals and said stage's input or output node, where m is the number of bits of resolution provided by said stage;

wherein the value Z of each of said impedances is given by:

$Z=Z_{total}/2^k$, where k is the sum of the number of bits of resolution provided by said stage and the number of bits of resolution provided by all other stages which provide more significant bits of resolution than said stage.

3. The digitally-switched impedance of claim 2, wherein, when one of said type A stages provides the LSB portion of said digitally-switched impedance's n-bit resolution, one of said upper and lower stages of said type A LSB stage comprises:

$2^m-1$ series-connected impedances having $2^m$ terminals, said stage's switch network comprising:

$2^m$ switches connected between respective ones of said $2^m$ terminals and said stage's input or output node;

and the other of said upper and lower stages of said type A LSB stage comprises:

$2^m$ series-connected impedances having $2^m+1$ terminals, said stage's switch network comprising:

$2^m$ switches connected between respective ones of said $2^m+1$ terminals and said stage's input or output node such that a terminal of one of said stage's impedances is not connected to said stage's switch network;

wherein the value Z of each of said impedances is given by:

$Z=Z_{total}/2^n$, such that said digitally-switched impedance can provide $2^n$ selectable impedance values between said final output node and said high and low reference nodes with a one bit zero-scale or full-scale offset.

4. The digitally-switched impedance of claim 2, wherein, when one of said type A stages provides the LSB portion of said digitally-switched impedance's n-bit resolution, each of said upper and lower stages of said type A LSB stage comprises:

$2^m-1$ series-connected impedances having $2^m$ terminals, said stage's switch network comprising:

$2^m-1$ switches connected between respective ones of said $2^m$ terminals and said stage's input or output node; and one LSB impedance connected to the input or output node of one of said non-LSB stages such that a terminal of said one LSB impedance is not connected to said non-LSB stage's switch network;

wherein the value Z of each of said impedances is given by:

$Z=Z_{total}/2^n$, such that said digitally-switched impedance can provide $2^n$ selectable impedance values between said final output node and said high and low reference nodes with a one bit zero-scale or full-scale offset.

5. The digitally-switched impedance of claim 2, wherein, when one of said type A stages provides the LSB portion of said digitally-switched impedance's n-bit resolution, one of said first and second stages of said type A LSB stage comprises:

$2^m-1$ series-connected impedances having $2^m$ terminals, said stage's switch network comprising:

$2^m$ switches connected between respective ones of said $2^m$ terminals and said stage's input or output node, and the other of said first and second stages of said type A LSB stage comprises:

$2^m$ series-connected impedances having $2^m+1$ terminals, said stage's switch network comprising:

$2^m+1$ switches connected between respective ones of said $2^m+1$ terminals and said stage's input or output node, wherein the value Z of each of said impedances is given by:

$Z=Z_{total}/2^n$, such that said digitally-switched impedance provides $2^n+1$ selectable impedance values between said final output node and said high and low reference nodes when said digital input signal has at least n+1 bits.

6. The digitally-switched impedance of claim 2, wherein, when one of said type A stages provides the LSB portion of said digitally-switched impedance's n-bit resolution, each of said upper and lower stages of said type A LSB stage comprises:

$2^m-1$ series-connected impedances having $2^m$ terminals, said stage's switch network comprising:

$2^m$ switches connected between respective ones of said $2^m$ terminals and said stage's input or output node;

one LSB impedance connected to the input or output node of one of said non-LSB stages; and one additional switch connected in parallel with the switches of said non-LSB stage's switch network such that both terminals of said one LSB impedance are connected to respective switches of said non-LSB stage's switch network;

wherein the value Z of each of said impedances is given by:

$Z=Z_{total}/2^n$, such that said digitally-switched impedance provides $2^n+1$ selectable impedance values between said final output node and said high and low reference nodes when said digital input signal has at least n+1 bits.

7. The digitally-switched impedance of claim 2, wherein, when said type B stage provides the LSB portion of said digitally-switched impedance's n-bit resolution, said type B stage comprises:
$2^m$ series-connected impedances having $2^m+1$ terminals, said type B stage's switch network comprising:
$2^m$ switches connected between respective ones of said $2^m+1$ terminals and said final output node such that a terminal of one of said stage's impedances is not connected to said stage's switch network;

wherein the value Z of each of said impedances is given by:

$$Z=Z_{total}/2^n,$$

such that said digitally-switched impedance can provide $2^n$ selectable impedance values between said final output node and said high and low reference nodes with a one bit zero-scale or full-scale offset.

8. The digitally-switched impedance of claim 2, wherein, when said type B stage provides the LSB portion of said digitally-switched impedance's n-bit resolution, said type B stage comprises:
$2^m-1$ series-connected impedances having $2^m$ terminals, said type B stage's switch network comprising:
$2^m$ switches connected between respective ones of said $2^m$ terminals and said final output node; and one LSB impedance connected to the input or output node of one of said non-LSB stages such that a terminal of said one LSB impedance is not connected to said non-LSB stage's switch network;

wherein the value Z of each of said impedances is given by:

$$Z=Z_{total}/2^n,$$

such that said digitally-switched impedance can provide $2^n$ selectable impedance values between said final output node and said high and low reference nodes with a one bit zero-scale or full-scale offset.

9. The digitally-switched impedance of claim 2, wherein, when said type B stage provides the LSB portion of said digitally-switched impedance's n-bit resolution, said type B stage comprises:
$2^m$ series-connected impedances having $2^m+1$ terminals, said type B stage's switch network comprising:
$2^m+1$ switches connected between respective ones of said $2^m+1$ terminals and said final output node;

wherein the value Z of each of said impedances is given by:

$$Z=Z_{total}/2^n,$$

such that said digitally-switched impedance provides $2^n+1$ selectable impedance values between said final output node and said high and low reference nodes when said digital input signal has at least n+1 bits.

10. The digitally-switched impedance of claim 2, wherein, when said type B stage provides the LSB portion of said digitally-switched impedance's n-bit resolution, said type B stage comprises:
$2^m-1$ series-connected impedances having $2^m$ terminals, said type B stage's switch network comprising:
$2^m$ switches connected between respective ones of said $2^m$ terminals and said final output node;

one LSB impedance connected to the input or output node of one of said non-LSB stages; and one additional switch connected in parallel with the switches of said non-LSB stage's switch network such that both terminals of said one LSB impedance are connected to respective switches of said non-LSB stage's switch network;

wherein the value Z of each of said impedances is given by:

$$Z=Z_{total}/2^n,$$

such that said digitally-switched impedance provides $2^n+1$ selectable impedance values between said final output node and said high and low reference nodes when said digital input signal has at least n+1 bits.

11. The digitally-switched impedance of claim 2, wherein, when said type B stage provides the LSB portion of said digitally-switched impedance's n-bit resolution, said type B stage comprises:
$2^m-1$ series-connected impedances having $2^m$ terminals, said type B stage's switch network comprising:
$2^m$ switches connected between respective ones of said $2^m$ terminals and said final output node;

wherein the value Z of each of said impedances is given by:

$$Z=Z_{total}/2^n,$$

such that said digitally-switched impedance can provide $2^n$ selectable impedance values between said final output node and said high and low reference nodes when said digital input signal has at least n bits.

12. The digitally-switched impedance of claim 2, wherein, when one of said type A stages provides the LSB portion of said digitally-switched impedance's n-bit resolution, each of said upper and lower stages of said type A LSB stage comprises:
$2^m-1$ series-connected impedances having $2^m$ terminals, said stage's switch network comprising:
$2^m$ switches connected between respective ones of said $2^m$ terminals and said stage's input or output node;

wherein the value Z of each of said impedances is given by:

$$Z=Z_{total}/2^n,$$

such that said digitally-switched impedance can provide $2^n$ selectable impedance values between said final output node and said high and low reference nodes when said digital input signal has at least n bits.

13. The digitally-switched impedance of claim 1, wherein at least some of said upper and lower stages are arranged such that each switch of the stage's switch network is connected at one end to said stage's input node, and at the other end to respective terminals along said stage's string of predetermined series-connected impedances, said string connected at one end to said stage's output node.

14. The digitally-switched impedance of claim 1, wherein at least some of said upper and lower stages are arranged such that each switch of the stage's switch network is connected at one end to said stage's output node, and at the other end to respective terminals along said stage's string of predetermined series-connected impedances, said string connected at one end to said stage's input node.

15. The digitally-switched impedance of claim 1, wherein said type B stage is arranged such that each switch of the stage's switch network is connected at one end to said final output node, and at the other end to respective terminals along said stage's string of predetermined series-connected impedances.

16. The digitally-switched impedance of claim 1, wherein said high and low reference nodes are connected to respective reference voltages to form a digital-to-analog converter (DAC) which produces a voltage at said final output node that varies with said digital input signal.

17. The digitally-switched impedance of claim 16, further comprising at least one additional impedance connected in series between said high reference node and said upper input node of said first type A stage and/or said low reference node and said lower input node of said first type A stage, to adjust the gain of said DAC.

18. The digitally-switched impedance of claim 16, further comprising at least one additional impedance connected in series between the upper output node of said last type A stage and the first input node of said type B stage and/or the lower output node of said last type A stage and the second input node of said type B stage, to adjust the gain of said DAC.

19. A digitally-switched resistive digital-to-analog converter (rDAC) for an n-bit digital input signal, comprising:
high and low analog reference voltage nodes;
one "type B" stage and two "type A" stages, each of said type A stages comprising an upper stage and a lower stage, each of which has an input node and an output node, and said type B stage having first and second input nodes and a final output node;
said type A stages coupled between said high and low analog reference voltage nodes and said type B stage such that:
the upper and lower input nodes of a first type A stage are connected to said high and low analog reference voltage nodes, respectively,
the upper and lower output nodes of the first type A stage are connected to the upper and lower input nodes, respectively, of the second type A stage, and
the upper and lower output nodes of said second type A stage are connected to the first and second input nodes, respectively, of said type B stage;
each of said upper and lower stages comprising:
a string of predetermined series-connected impedances, and
a switch network arranged to connect a selected number of said string's series-connected impedances between said stage's input node and output node;
said type B stage comprising:
a string of predetermined impedances series-connected between said first and second input nodes, and
a switch network connected to said string to provide a selectable tap from said string to said final output node; and
a decoder which responds to an n-bit digital input signal by controlling said switch networks to switch selectable portions of the strings in said type A stages into a series connection with said type B stage's string, said decoder further controlling said type B stage's switch network to tap said type B stage's string at a location to provide an analog voltage corresponding to said n-bit digital input signal between said final output node and at least one of said high and low analog reference voltage nodes, the selected portions having a substantially constant aggregate series impedance $Z_{total}$ between said high and low analog reference voltage nodes over the switching ranges of said type A stages,
the number and impedance values of the impedances in said stages arranged such that each stage provides a portion of the digitally-switched impedance's n-bit resolution and that the sum of the bits of resolution provided by each stage equals the total n-bit resolution.

20. The digitally-switched resistive DAC of claim 19, wherein said DAC is a 6-bit DAC and each of said three stages provides two bits of the total resolution.

21. The digitally-switched resistive DAC of claim 19, wherein said DAC is a 9-bit DAC and each of said three stages provides three bits of the total resolution.

22. The digitally-switched resistive DAC of claim 19, wherein said DAC is a 7-bit DAC, such that two of said stages each provide two bits of the total resolution and one of said stages provides three bits of the total resolution.

23. A digitally-switched variable impedance for an n-bit digital input signal, comprising:
an input terminal;
an output terminal;
at least two stages, each of which has an input node and an output node, said stages coupled between said input and output nodes such that:
the input node of a first stage is connected to said input terminal, and
the output node of each stage is connected to the input node of a following stage, except for a next-to-last stage, the output node of which is connected to the input node of a last stage, the output node of said last stage being said output terminal;
each of said stages comprising:
a string of predetermined series-connected impedances, and
a switch network arranged to connect a selected number of said string's series-connected impedances between said stage's input node and output node; and
a decoder which responds to an n-bit digital input signal by controlling said switch networks to switch selectable portions of the strings in said stages into a series connection between said input and output terminals to provide an impedance corresponding to said n-bit digital input signal between said input and output terminals,
the number and impedance values of the impedances in said stages arranged such that each stage provides a portion of the digitally-switched variable impedance's n-bit resolution and that the sum of the bits of resolution provided by each stage equals the total n-bit resolution.

24. The digitally-switched variable impedance of claim 23, wherein, for each stage not providing the LSB portion of said digitally-switched impedance's n-bit resolution, each of said stages comprises:
$2^m-1$ series-connected impedances having $2^m$ terminals, said stage's switch network comprising:
$2^m$ switches connected between respective ones of said $2^m$ terminals and said stage's input or output node, where m is the number of bits of resolution provided by said stage;

wherein the value Z of each of said impedances is given by:

$Z=Z_{total}/2^k$, where k is the sum of the number of bits of resolution provided by said stage and the number of bits of resolution provided by all other stages which provide more significant bits of resolution than said stage.

25. The digitally-switched variable impedance of claim 24, wherein the stage which provides the LSB portion of said digitally-switched variable impedance's n-bit resolution comprises:

$2^m-1$ series-connected impedances having $2^m$ terminals, said stage's switch network comprising:

$2^m$ switches connected between respective ones of said $2^m$ terminals and said stage's input or output node;

wherein the value Z of each of said impedances is given by:

$Z=Z_{total}/2^n$, such that said digitally-switched impedance can provide $2^n$ selectable impedance values between said input and output terminals.

26. The digitally-switched variable impedance of claim 24, wherein the stage which provides the LSB portion of said digitally-switched variable impedance's n-bit resolution comprises:

$2^m$ series-connected impedances having $2^m+1$ terminals, said stage's switch network comprising:

$2^m+1$ switches connected between respective ones of said $2^m+1$ terminals and said stage's input or output node, wherein the value Z of each of said impedances is given by:

$Z=Z_{total}/2^n$, such that said digitally-switched impedance provides $2^n+1$ selectable impedance values between said input and output terminals when said digital input signal has at least n+1 bits.

* * * * *

UNITED STATES PATENT AND TRADEMARK OFFICE
CERTIFICATE OF CORRECTION

PATENT NO. : 6,885,328 B1
DATED : April 26, 2005
INVENTOR(S) : Kao et al.

It is certified that error appears in the above-identified patent and that said Letters Patent is hereby corrected as shown below:

Column 14,
Line 3, delete "$2^m-1$" and insert -- $2^m$ --.

Signed and Sealed this

Sixteenth Day of August, 2005

JON W. DUDAS
*Director of the United States Patent and Trademark Office*